(12) United States Patent
Jeong et al.

(10) Patent No.: US 10,262,708 B2
(45) Date of Patent: Apr. 16, 2019

(54) MEMORY SYSTEM PERFORMING TRAINING OPERATION

(71) Applicant: Samsung Electronics Co., Ltd., Suwon-si, Gyeonggi-do (KR)

(72) Inventors: Byunghoon Jeong, Hwaseong-si (KR); Jeongdon Ihm, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/825,504

(22) Filed: Nov. 29, 2017

(65) Prior Publication Data

US 2018/0204773 A1    Jul. 19, 2018

(30) Foreign Application Priority Data

Jan. 13, 2017    (KR) .................. 10-2017-0005850

(51) Int. Cl.

| G11C 8/12 | (2006.01) |
|---|---|
| H01L 21/822 | (2006.01) |
| G11C 16/16 | (2006.01) |
| H01L 27/11556 | (2017.01) |
| G11C 16/04 | (2006.01) |
| G11C 7/22 | (2006.01) |
| G11C 29/02 | (2006.01) |

(Continued)

(52) U.S. Cl.
CPC ............. *G11C 8/12* (2013.01); *G11C 7/222* (2013.01); *G11C 16/0483* (2013.01); *G11C 16/16* (2013.01); *G11C 29/023* (2013.01); *G11C 29/028* (2013.01); *H01L 21/8221* (2013.01); *H01L 27/11556* (2013.01); *G11C 16/3445* (2013.01); *G11C 2207/2254* (2013.01); *H01L 21/32137* (2013.01); *H01L 27/0688* (2013.01)

(58) Field of Classification Search
CPC ........... H01L 21/8221; H01L 27/11556; H01L 21/32137; H01L 27/0688; G11C 16/16; G11C 16/0483; G11C 16/3445
See application file for complete search history.

(56) References Cited

U.S. PATENT DOCUMENTS

| 7,679,133 B2 | 3/2010 | Son et al. |
|---|---|---|
| 8,519,737 B2 | 8/2013 | Fai et al. |

(Continued)

*Primary Examiner* — Ajay Ojha
(74) *Attorney, Agent, or Firm* — Harness, Dickey & Pierce, P.L.C.

(57) ABSTRACT

A memory system may include a nonvolatile memory device and a controller. The nonvolatile memory device may include a data area and a device information area, the device information area being inaccessible accessed by a host. The controller may be configured to perform the training operation with respect to a data signal transmitted to or received from the nonvolatile memory device based on training information stored in the device information area. The controller may be configured to select one of a first training operation and a second training operation based on an identification code of the training information, and to perform the selected one of the first training operation based on a rooted training code generated by the controller and the second training operation based on a dynamic training code of the training information, the second training operation including performing a fewer number of searches than the first training operation.

18 Claims, 17 Drawing Sheets

(51) Int. Cl.
   *G11C 16/34*      (2006.01)
   *H01L 27/06*      (2006.01)
   *H01L 21/3213*    (2006.01)

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,683,164 B2 | 3/2014 | Jeddeloh | |
| 9,361,985 B2 | 6/2016 | Kim et al. | |
| 9,389,876 B2 | 7/2016 | Emma et al. | |
| 2008/0276133 A1* | 11/2008 | Hadley | G11C 7/1066 |
| | | | 714/56 |
| 2010/0082967 A1* | 4/2010 | Lo | G11C 5/04 |
| | | | 713/2 |
| 2011/0233648 A1 | 9/2011 | Seol et al. | |
| 2014/0032826 A1 | 1/2014 | Lee et al. | |
| 2014/0317334 A1 | 10/2014 | Gadsing | |
| 2016/0118984 A1 | 4/2016 | Chern et al. | |
| 2017/0075837 A1* | 3/2017 | Lee | H03L 7/10 |
| 2017/0330607 A1* | 11/2017 | Lo | G11C 8/12 |

\* cited by examiner

MEMORY SYSTEM PERFORMING TRAINING OPERATION

CROSS-REFERENCE TO RELATED APPLICATIONS

This U.S. non-provisional patent application claims priority under 35 U.S.C. § 119 of Korean Patent Application No. 10-2017-0005850, filed on Jan. 13, 2017, the entire contents of which are hereby incorporated by reference.

BACKGROUND

Example embodiments of the inventive concepts relate to memory systems. For example, at least some example embodiments relate to a memory system selectively performing a training operation in order to compensate for different timing skews and align data signals, thereby maintaining an optimal (or desired) reliability of the data signals.

A semiconductor memory device may be embodied using a semiconductor such as silicon Si, germanium Ge, gallium arsenide GaAs, indium phosphide InP, etc. A semiconductor memory device may be classified as a volatile memory device or a nonvolatile memory device.

A volatile memory device may lose its stored data when a power supply is interrupted. Examples of the volatile memory device are a static RAM (SRAM), a dynamic RAM (DRAM), a synchronous DRAM, etc. A nonvolatile memory device may retain its stored data even when a power supply is interrupted. Examples of the nonvolatile memory device are a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

A semiconductor memory device may exchange data signals DQ with a memory controller. The data signals DQ may have different timing skews due to a variation of PVT (process, voltage, temperature) and an environment difference of a channel. Thus, performing a training operation with respect to the data signals DQ may be desirable in order to compensate for the different timing skews and align the data signals DQ, thereby maintaining an optimal (or desired) reliability of the data signals DQ. However, performing a rooted (full) training operation of searching all bits of a training code with respect to the data signals DQ may take a great deal of time.

SUMMARY

Some example embodiments of the inventive concepts provide a memory system including a nonvolatile memory device including a data area and a device information area, the device information area being inaccessible by a host; and a controller configured to perform a training operation with respect to a data signal transmitted to or received from the nonvolatile memory device based on training information stored in the device information area, the controller being configured to select a selected one of a first training operation and a second training operation based on an identification code of the training information, and to perform the selected one of the first training operation and the second training operation such that, the first training operation is performed based on a rooted training code generated by the controller, and the second training operation is performed based on a dynamic training code of the training information, the second training operation including performing a fewer number of searches than the first training operation.

Some example embodiments of the inventive concepts provide a memory system including a nonvolatile memory device including a data area and a device information area, the device information area being inaccessible by a host; a dynamic random access memory configured to temporarily store data received from the host and data read from the nonvolatile memory device; and a controller configured to perform a DRAM training operation with respect to a data signal transmitted to or received from the dynamic random access memory based on DRAM training information stored in the device information area, the controller being configured to select a selected one of a first DRAM training operation and a second DRAM training operation based on a DRAM identification code of the DRAM training information, and to perform the selected one of the first DRAM training operation and the second DRAM training operation such that, the first DRAM training operation is performed based on a DRAM rooted training code generated by the controller, and the second DRAM training operation is performed based on a DRAM dynamic training code of the DRAM training information, the second DRAM training operation including performing a fewer number of searches than the first DRAM training operation.

Some example embodiments of the inventive concepts provide a controller configured to communicate with one or more of a nonvolatile memory device and a dynamic random access memory, the nonvolatile memory device including a data area and a device information area, the device information area storing training information and being inaccessible by a host, and the dynamic random access memory configured to temporarily store data received from the host and data read from the nonvolatile memory device, the controller including at least one processor configured to selectively perform one or more of a rooted training operation and a mirror training operation with respect to at least one data signal based on the training information stored in the device information area, the at last one data signal being transmitted to or received from at least one of the nonvolatile memory device and the dynamic random access memory, the training information including one or more of an NVM identification code and a DRAM identification code, the mirror training operation including performing a fewer number of searches than the rooted training operation.

BRIEF DESCRIPTION OF THE FIGURES

Example embodiments of the inventive concepts will be described below in more detail with reference to the accompanying drawings. Some example embodiments of the inventive concepts may, however, be embodied in different forms and should not be constructed as being limited to the example embodiments set forth herein. Rather, these example embodiments are provided so that this disclosure will be thorough and complete, and will fully convey the scope of the inventive concepts to those skilled in the art. Like numbers refer to like elements throughout.

DETAILED DESCRIPTION

Below, some example embodiments of inventive concepts will now be described more fully so that those skilled in the art can easily comprehend the inventive concepts. The term "training" may mean herein that an operation searching a latency or a signal level of a channel of a memory is performed to provide optimal (or desired) reliability.

Figure 1:
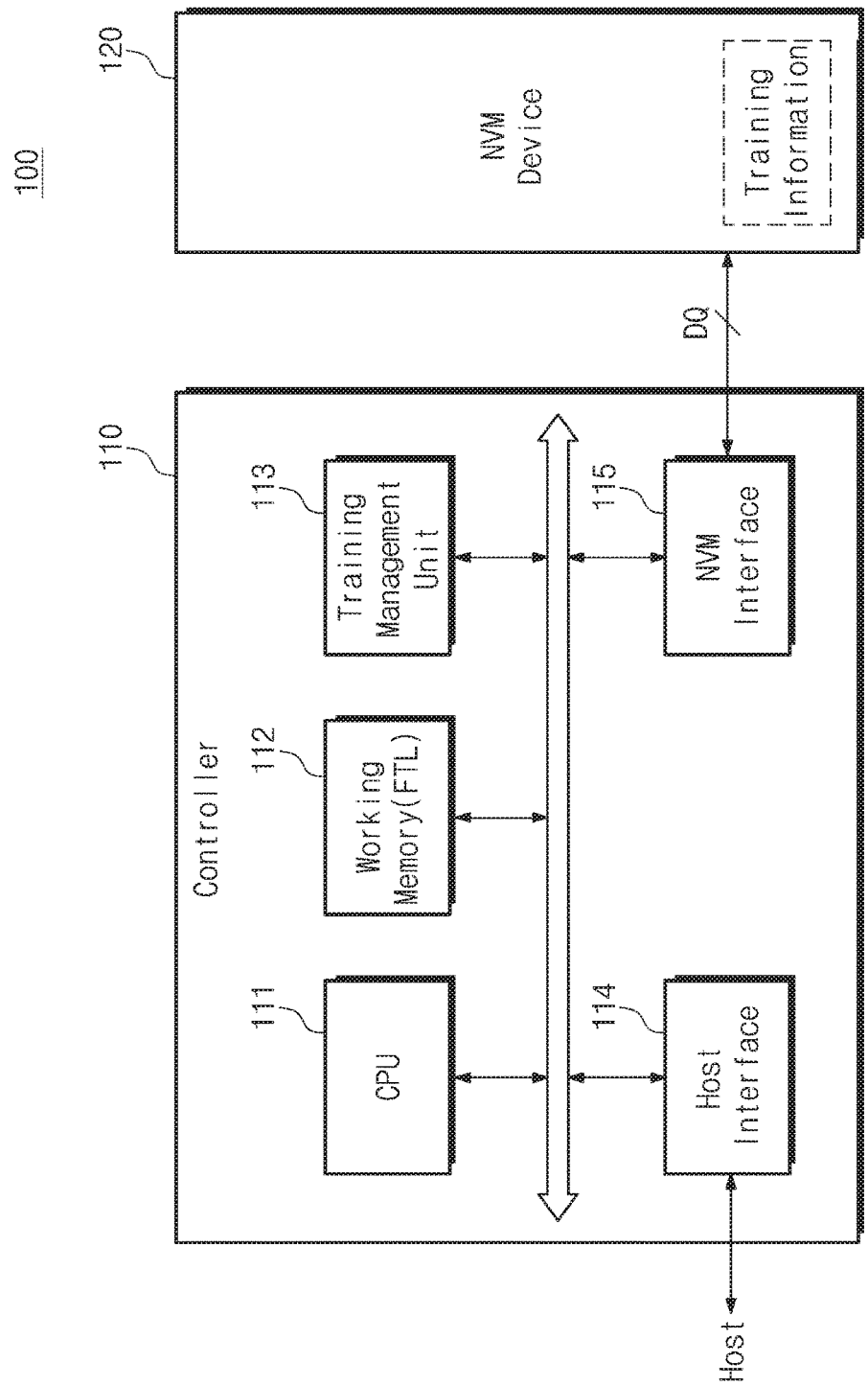
FIG. 1 is a block diagram illustrating a memory system according to some example embodiments of the inventive concepts.

FIG. 1 is a block diagram illustrating a memory system according to some example embodiments of the inventive concepts.

Referring to FIG. 1, a memory system 100 may include a controller 110 and a nonvolatile memory device 120. The controller 110 and the nonvolatile memory device 120 may exchange a plurality of data signals DQ with each other through a channel. For example, the channel may include a plurality of transmission lines and each transmission line may transmit each data signal DQ. The memory system 100 may periodically perform a training operation to maintain an optimal (or desired) reliability of the data signals DQ.

The controller 110 may include a central processing unit (CPU) 111, a working memory 112, a training management unit 113, a host interface 114, and a nonvolatile memory interface 115. However, the configuration elements of the controller 110 may not be limited thereto. For example, the controller 110 may further include a ROM storing code data necessary for an initial booting operation, an error correction unit (ECC) recovering damaged data, SDRAM, etc.

The CPU 111 may include at least one processor implemented by at least one semiconductor chip disposed on a printed circuit board. The at least one processor may be an arithmetic logic unit, a digital signal processor, a microcomputer, a field programmable array, a programmable logic unit, a microprocessor or any other device capable of responding to and executing computer-readable instructions in a defined manner. The same or a similar description also applies to at least CPU 211 of FIG. 10, CPU 1110 of FIG. 16 and CPU 3400 of FIG. 18, discussed below in connection with some other example embodiments of the inventive concepts.

The CPU 111 may control an overall operation of the controller 110. For example, the CPU 111 may be configured to drive firmware to control the controller 110. The firmware may be loaded into the working memory 112. The CPU 111 may decode a command transmitted from a host. The CPU 111 may control the nonvolatile memory interface 115 to perform a read or write access memory included in the command.

The working memory 112 may store firmware and data to control the controller 110. For example, the stored firmware and the stored data may be driven by the CPU 111. The working memory 112 may include at least one of a cache, a DRAM, a SRAM, a PRAM, a ROM, and flash memory devices. The working memory 112 may store a flash translation layer (FTL). A read/write unit and an erase unit may be different in the nonvolatile memory device 120. Thus, it may be desirable for the FTL to manage the read/write/erase operations of the nonvolatile memory device 120.

Various processing circuitry may be configured, through a layout design and/or execution of computer-readable instructions stored in a memory device (e.g., a non-transitory computer-readable storage medium), as a special purpose computer to perform the functions of the controller 110 (and the sub-components thereof). In some example embodiments, the CPU 111 may be programmed with instructions that configure the CPU 111 to perform the functions of the training management unit 113. In some other example embodiments, the training management unit 113 (and processing circuitry included therein) may include discrete hardware circuitry, such as one or more application-specific integrated circuits (ASICs), designed to perform the functions of the training management unit 113 (and the processing circuitry included therein).

The training management unit 113 may manage a training operation of data signals DQ between the controller 110 and the nonvolatile memory device 120. For example, the training operation may include a rooted training and a mirror training. Performing the rooted training may include the training management unit 113 searching all sections of the data signal DQ to find an optimum (or desired) timing skew. Since the training management unit 113 searches all sections of the data signal DQ in performing the rooted training, an optimal (or desired) reliability may be secured. However, it may take a lot of time for the training management unit 113 to search all the sections of the data signal DQ. The rooted training may be called a full training.

Performing the mirror training may include the training management unit 113 searching a specific point in time of the data signal DQ using training information stored in advance. Thus, the mirror training may shorten a length of time spent by the training management unit in performing the training operation. The training management unit 113 may store training information obtained through a previously performed training operation in the nonvolatile memory device 120. Thus, when the training information is stored, the controller 110 may rapidly perform the training operation using the stored training information.

The training information may be stored in a device information area of the nonvolatile memory device 120. For example, the nonvolatile memory device 120 may include a data area and the device information area. The data area may store data received from the host and may be accessed by the host. The device information area may store data necessary for an operation of the memory system 100 and internal configuration setting data of the nonvolatile memory device 120, and the device information area may not be accessible by the host.

When the memory system 100 performs the training operation, the training management unit 113 may read the training information stored in the nonvolatile memory device 120. The training information may include an identification code and a dynamic training code. The identification code may indicate whether to perform the rooted training. The identification code may include an initial identification code and a post identification code. First, the identification code may be set to the initial identification code. After performing the training operation, the training management unit 113 may change the identification code to the post identification code. The training management unit 113 may change the identification code from the post identification code to the initial identification code again based on a request from the host.

When the identification code is the initial identification code, the training management unit 113 may perform the rooted training. When the identification code is the post identification code, the training management unit 113 may perform the mirror training. When performing the mirror training, the training management unit 113 may perform the training operation using the dynamic training code stored in the device information area of the nonvolatile memory device 120. Thus, the mirror training may be performed by the training management unit 113 in a shorter amount of time as compared to the rooted training. The training management unit 113 may update the dynamic training code after performing either of the rooted training and/or the mirror training.

The host interface 114 may provide an interface between the host and the controller 110. The host and the controller 110 may be connected through one of various standard interfaces. The host and the controller 110 may be connected through several interfaces among various standard interfaces. The standard interfaces may include various interface methods such as an advanced technology attachment (ATA), a parallel ATA (PATA), a serial ATA (SATA), an external SATA (e-SATA), a small computer small interface (SCSI), a serial attached SCSI (SAS), a peripheral component interconnection (PCI), a PCI express (PCI-E), a universal serial bus (USB), an IEEE 1394, a non-volatile memory express (NVMe), a card interface, etc.

The nonvolatile memory interface 115 may provide an interface between the controller 110 and the nonvolatile memory device 120. The nonvolatile memory interface 115 may schedule a read/write/erase command of the nonvolatile memory device 120. The nonvolatile memory interface 115 may transmit data received from the host to the nonvolatile memory device 120 through a channel. Data read from the nonvolatile memory device 120 may be transmitted to the host by the nonvolatile memory interface 115.

The nonvolatile memory device 120 may be provided as storage medium (e.g., a non-transitory computer-readable storage medium). For example, the nonvolatile memory device 120 may be provided as a NAND-type flash memory having high storage capacity. The controller 110 may be connected to the nonvolatile memory device 120 through the channel. In another example embodiment, the controller 110 may be connected to the nonvolatile memory device 120 through a plurality of channels. The nonvolatile memory device 120 may include the data area and the device information area. The training information may be stored in the device information area that may not be accessible by the host.

A read/write operation of the nonvolatile memory device 120 may be performed in units of pages and an erase operation of the nonvolatile memory device 120 may be performed in units of blocks. Because of a characteristic of the nonvolatile memory device 120, managing a read/write/erase operation of the nonvolatile memory device 120 may be desirable. The flash translation layer (FTL) is system software (or firmware) developed for this purpose. Desirably, the FTL may manage the nonvolatile memory device 120 to operate in response to an access (e.g., a read/write/erase operation) requested from the host. The FTL may be loaded into the working memory 112 to be driven by the CPU 111.

The memory system 100 may store the training information in the device information area of the nonvolatile memory device 120. The memory system 100 may selectively perform either of the rooted training and/or the mirror training according to the training information. The memory system 100 may secure an optimal (or desired) reliability through the rooted training. However, if the rooted training is performed all the time, an operation speed of the memory system 100 may be reduced. Thus, the memory system 100 may reduce a training operation time by selectively performing either of the rooted training and/or the mirror training.

Figure 2:
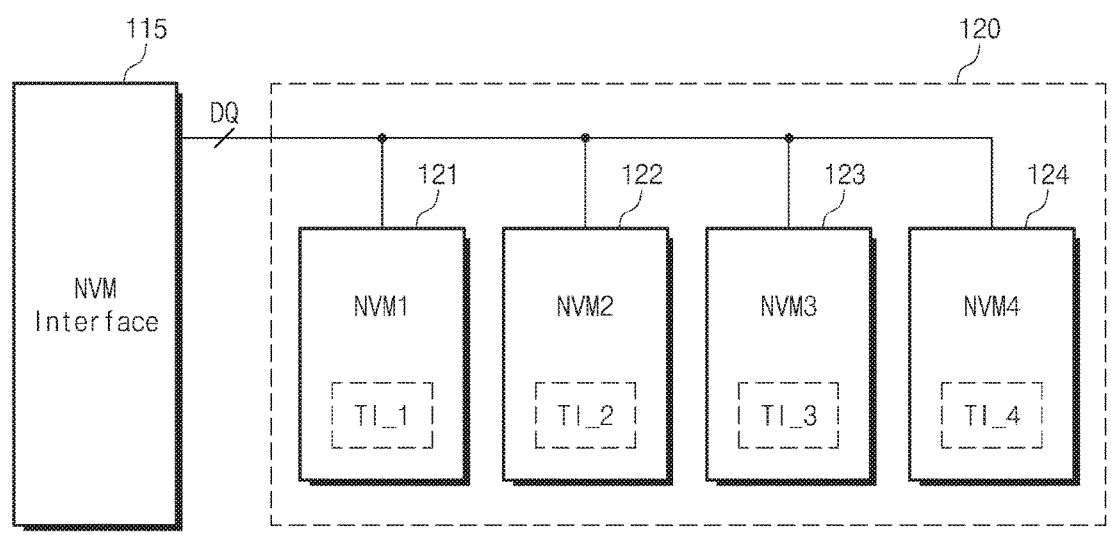
FIG. 2 is a block diagram illustrating a nonvolatile memory device of FIG. 1 according to some example embodiments of the inventive concepts.

FIG. 2 is a block diagram illustrating a nonvolatile memory device of FIG. 1 according to some example embodiments of the inventive concepts.

Referring to FIG. 2, the nonvolatile memory device 120 may include first through fourth nonvolatile memories (121 to 124). For example, the first through fourth nonvolatile memories (121 to 124) may be connected to the nonvolatile memory interface 115 through a channel. The channel may transmit and receive a plurality of data signals DQ. However, the nonvolatile memory device 120 is not limited thereto. The nonvolatile memory device 120 may include at least one nonvolatile memory. The nonvolatile memory device 120 may be connected to the nonvolatile memory interface 115 through a plurality of channels.

The controller 110 may perform a training operation of each of the first through fourth nonvolatile memories (121 to 124). For example, because of a PVT (process, voltage, temperature) variation and an environment difference of the channel, the first through fourth nonvolatile memories (121 to 124) may have different timing skews with respect to the data signal DQ. Thus, the first through fourth nonvolatile memories (121 to 124) may store first through fourth training information (TI_1 to TI_4), respectively. After performing the training operation, the training management unit 113 may update the first through fourth training information (TI_1 to TI_4) stored in the first through fourth nonvolatile memories (121 to 124).

Figure 3:
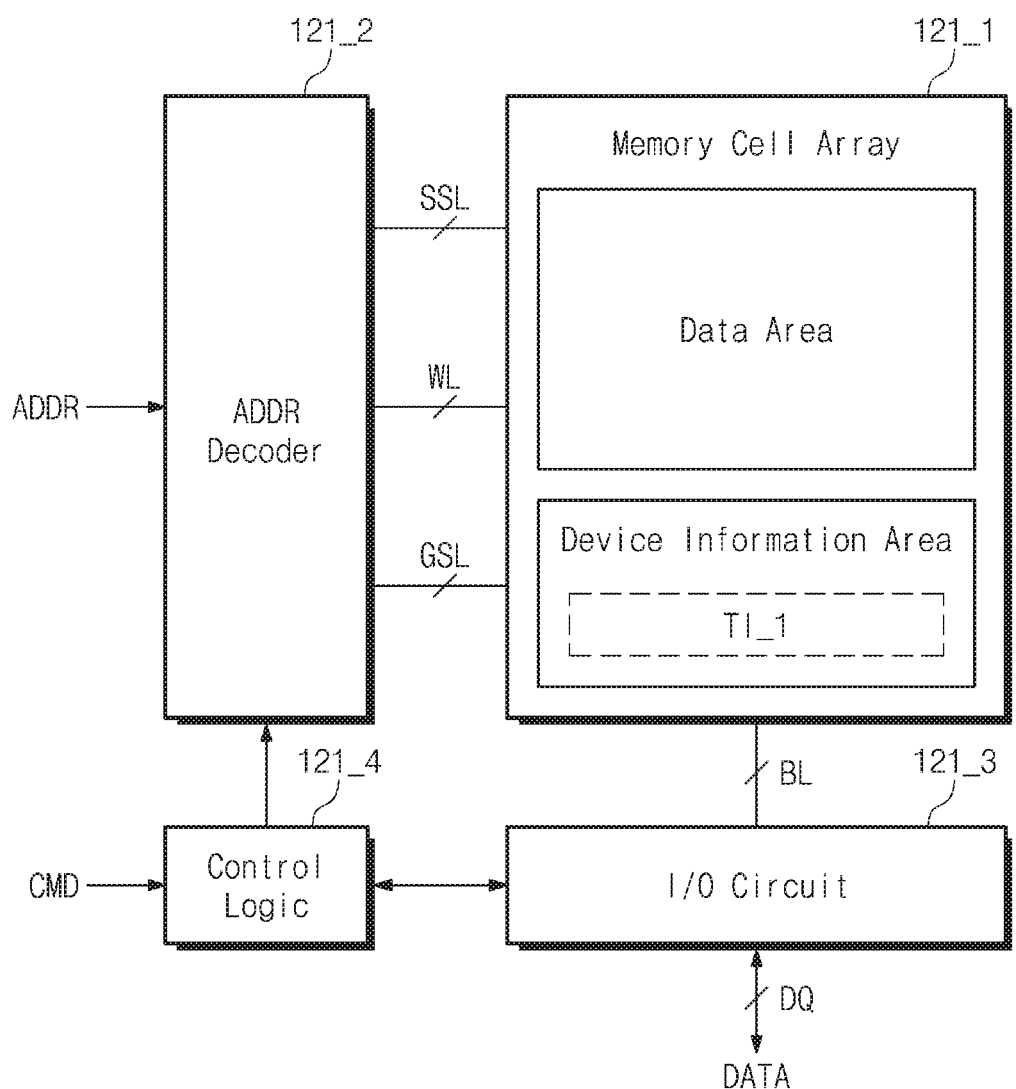
FIG. 3 is a block diagram illustrating one of the nonvolatile memories of FIG. 2 according to some example embodiments of the inventive concepts.

FIG. 3 is a block diagram illustrating one of the nonvolatile memories of FIG. 2 according to some example embodiments of the inventive concepts.

Referring to FIG. 3, the first nonvolatile memory 121 may include a memory cell array 121_1, an address decoder 121_2, an input/output circuit 121_3, and control logic 121_4. The second through fourth nonvolatile memories (122 to 124) may have a configuration which is the same as or similar to that of the first nonvolatile memory 121. The first nonvolatile memory 121 is described below as an example embodiment, but the same or a similar description may also apply with respect to one or more of the second through fourth nonvolatile memories (122 to 124).

The memory cell array 121_1 may be connected to the address decoder 12_2. The memory cell array 121_1 may be connected to the input/output circuit 121_3 through bit lines BL. The memory cell array 121_1 may include a plurality of memory blocks. Memory cells of each memory block may form a two-dimensional structure. Memory cells of each memory block may be stacked in a direction perpendicular to substrate to form a three-dimensional structure. Memory cells of each memory block may store at least one bit per cell.

In an example embodiment of the inventive concepts, the memory cell array 121_1 may be provided as a three dimensional (3D) memory array. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array may be directly deposited on the layers of each underlying level of the array.

In an example embodiment of the inventive concepts, the 3D memory array may include vertical NAND strings that may be vertically oriented such that at least one memory cell may be located over another memory cell. The at least one memory cell may include a charge trap layer. Each vertical NAND string may include at least one select transistor located over memory cells, and the at least one select transistor may have the same or a similar structure with the memory cells and may be formed monolithically together with the memory cells.

The following patent documents, which are hereby incorporated by reference, describe various suitable configurations for three-dimensional memory arrays, in which a three-dimensional memory array may be configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory cell array 121_1 may include a data area and a device information area. The data area may store data received from the host and may be accessed by the host. The device information area may store data for an operation of the memory system 100 and internal configuration setting data of the first nonvolatile memory 121, and the device information area may not be accessible by the host. The controller 110 may store the first training information TI_1 of the first nonvolatile memory 121 in the device information area of the memory cell array 121_1.

The address decoder 121_2 may be connected to the memory cell array 121_1 through a plurality of lines. For example, the plurality of lines may be string select lines SSL, word lines WL, and ground select lines GSL. The address decoder 121_2 may be configured to operate in response to a control of the control logic 121_4.

The address decoder 121_2 may receive addresses ADDR from the outside. The address decoder 121_2 may decode a row address among the addresses ADDR. The address decoder 121_2 may select a word line corresponding to the decoded row address.

The address decoder 121_2 may be configured to decode a column address among the received addresses ADDR. The address decoder 121_2 may transmit the decoded column address to the input/output circuit 121_3. The address decoder 121_2 may include a row decoder decoding a row address, a column decoder decoding a column address, and an address buffer storing the addresses ADDR.

The input/output circuit 121_3 may be connected to the memory cell array 121_1 through the bit lines BL. The input/output circuit 121_3 may operate in response to a control of the control logic 121_4. The input/output circuit 121_3 may receive the decoded column address from the address decoder 121_2. The input/output circuit 121_3 may select the bit lines BL using the decoded column address.

The control logic 121_4 may be connected to the address decoder 121_2 and the input/output circuit 121_3. The control logic 121_4 may be configured to control an overall operation of the first nonvolatile memory 121. The control logic 121_4 may operate in response to a command signal CMD transmitted from the outside.

Figure 4:
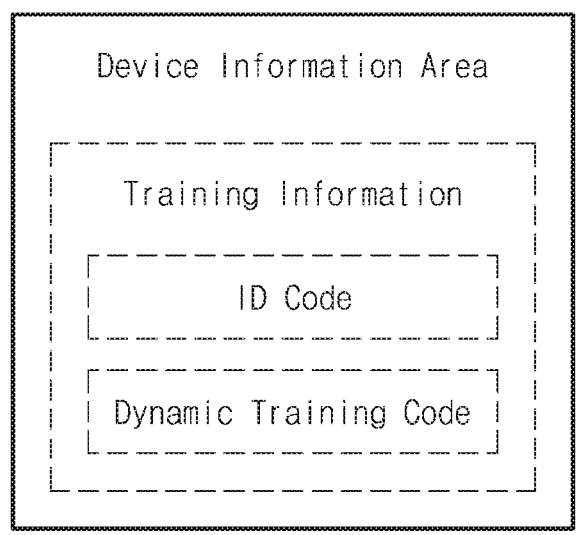
FIG. 4 is a view illustrating a device information area of a nonvolatile memory device according to some example embodiments of the inventive concepts.

FIG. 4 is a view illustrating a device information area of a nonvolatile memory device according to e example embodiments of the inventive concepts.

Referring to FIG. 4, the training information of the nonvolatile memory device 120 may be stored in the device information area of the memory cell array. The device information area may store data for an operation of the memory system 100 and internal configuration setting data of the nonvolatile memory device 120, and the device information area may not be accessible by the host.

The training information may include an identification code (ID code) and a dynamic training code. The identification code may indicate whether to perform the rooted training. The identification code may include an initial identification code and a post identification code. First, the identification code may be set to the initial identification code. After performing the rooted training operation, the controller 110 may change the identification code to the post identification code. The controller 110 may change the identification code from the post identification code to the initial identification code again based on a request from the host. When the identification code is the initial identification code, the training management unit 113 may perform the rooted training. When the identification code is the post identification code, the training management unit 113 may perform the mirror training. When performing the mirror training, the training management unit 113 may perform the training operation using the dynamic training code stored in the device information area of the nonvolatile memory device 120.

After performing the training operation, the training management unit 113 may update the dynamic training code to a new training code. For example, the training management unit 113 may store the post identification code for performing the mirror training in the device information area after performing the rooted training. The training management unit 113 may store a new dynamic training code that reflects a result of the training operation in the device information area. Thus, when performing a next training operation, the controller 110 may rapidly perform the training operation sing the updated dynamic training code.

Figure 5:
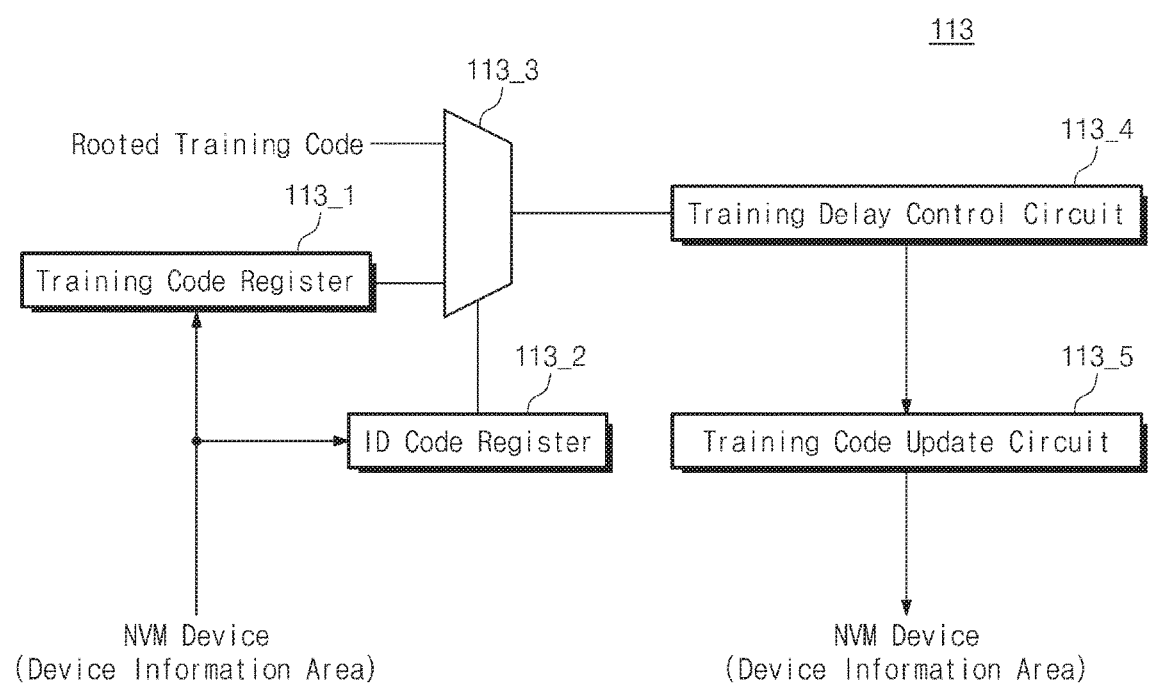
FIG. 5 is a block diagram illustrating a training management unit of FIG. 1 according to some example embodiments of the inventive concepts.

FIG. 5 is a block diagram illustrating a training management unit of FIG. 1 according to some example embodiments of the inventive concepts.

Referring to FIG. 5, the training management unit 113 may include a training code register 113_1, an identification code register 113_2, a multiplexer 113_3, a training delay control circuit 113_4, and a training code update circuit 113_5.

In example embodiments, the CPU 111 of FIG. 1 may be programmed with instructions that configure the CPU 111 to perform the functions of the training delay control circuit 113_4 and the training code update circuit 113_5. In some other example embodiments, the training delay control circuit 113_4 and the training code update circuit 113_5 may include discrete hardware circuitry, such as one or more application-specific integrated circuits (ASICs), designed to perform the functions of the training delay control circuit 113_4 and the training code update circuit 113_5, respectively.

The training delay control circuit 113_4 may perform a training operation based on code data received from the multiplexer 113_3. In the training operation, the training management unit 113 may read an identification code from the device information area of the nonvolatile memory device 120 to store the read identification code in the identification code register 113_2. In the training operation, the training management unit 113 may read a dynamic training code from the device information area of the nonvolatile memory device 120 to store the read dynamic training code in the training code register 113_1.

When the identification code is the initial identification code, the multiplexer 113_3 may output a rooted training code generated by the controller 110. The training delay control circuit 113_4 may perform the rooted training according to the rooted training code. The training delay control circuit 113_4 may search all sections of the data signal DQ according to the rooted training code. For example, the rooted training code may include all training codes within a training range. The training codes within the training range may be continuously input as the rooted training code.

When the identification code is the post identification code, the multiplexer 113_J may output the dynamic training code stored in the training code register 113_1. The training delay control circuit 113_4 may perform the mirror training according to the dynamic training code.

After the training operation is completed, the training delay control circuit 113_4 may transmit a result of the training operation to the training code update circuit 113_5. The training code update circuit 113_5 may store the n new training code in the device information area of the nonvolatile memory device 120 as a dynamic training code based on the result of the training operation. The training code update circuit 113_5 may also change an identification code. After the training delay control circuit 113_4 performs the rooted training, the training code update circuit 113_5 may store the post identification code in the device information area of the nonvolatile memory device 120. Thus, in a next training operation after performing the rooted training, the training delay control circuit 113_4 may perform the mirror training. The training code update circuit 113_5 may also change the post identification code to the initial identification code again based on a command received from the host.

Figure 6:
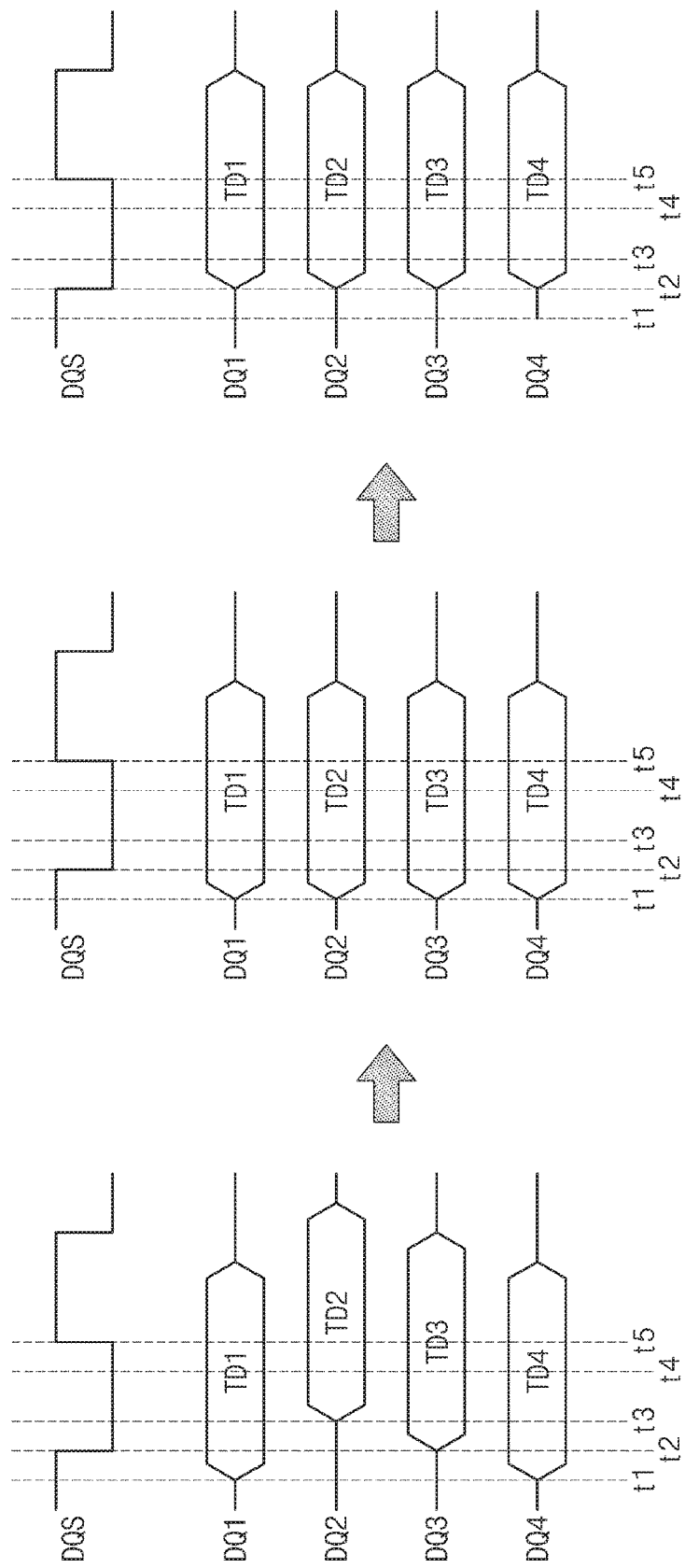
FIG. 6 is a view illustrating a training operation according to some example embodiments of the inventive concepts.

FIG. 6 is a view illustrating a training operation according to some example embodiments of the inventive concepts.

Referring to FIG. 6, it is assumed that four data signals (DQ1 to DQ4) may be transmitted through a channel in an example embodiment. However, the number of the data signals that may be transmitted through the channel is not limited thereto in some other example embodiments.

Before the training operation, the first through fourth data signals (DQ1 to DQ4) may begin at different points in time. A rising edge of a data strobe signal DQS and centers of the first through fourth data signals (DQ1 to DQ4) may not be located on a same straight line. Thus, at this time, it may be desirable for the controller 110 to perform the training operation in order to compensate for different timing skews and align the first through fourth data signals (DQ1 to DQ4), thereby maintaining an optimal (or desired) reliability of the first through fourth data signals (DQ1 to DQ4).

In the training operation, first, beginning points in time of the first through fourth data signals (DQ1 to DQ4) and a beginning point in time of the first data signal DQ1, that is, a first point in time (t1) may be adjusted by the controller 110 to be located on the same straight line. Next, the beginning points in time of the first through fourth data signals (DQ1 to DQ4) may be adjusted by the controller 110 to a second point in time (t2) such that a center of each of the first through fourth data signals (DQ1 to DQ4) and a rising edge (t5) of the data strobe signal DQS are on the same straight line.

Figure 7:
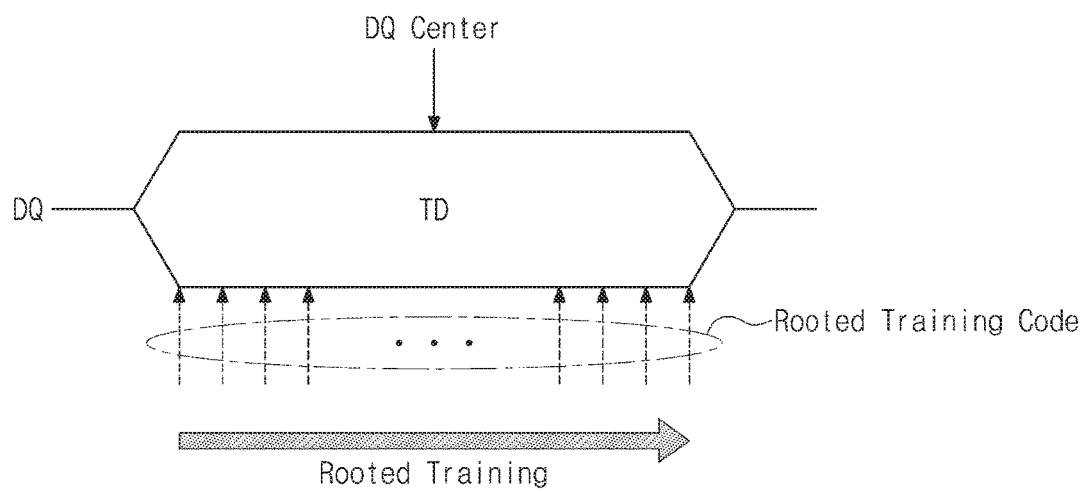
FIG. 7 is a view illustrating a rooted training according to some example embodiments of the inventive concepts.

The controller 110 may perform a training operation including an operation of searching the center of each of the first through fourth data signals (DQ1 to DQ4). The training operation may include a rooted training and mirror training. FIG. 7 describes the rooted training and FIG. 8 describes the mirror training.

FIG. 7 is a view illustrating a rooted training according to some example embodiments of the inventive concepts.

Referring to FIG. 7, when performing the rooted training, the controller 110 may search all sections of the data signal DQ based on the training code generated by the controller 110. For example, the rooted training code may include all training codes within a training range. When performing the rooted training, if a 5-bit training code is used, the controller 110 may generate rooted training codes having values ranging from the lowest value (00000) to the highest value (11111). The controller 110 may find a center of the data signal DQ based on a search result. By performing the rooted training, the controller 110 may reliably find the center of the data signal DQ. However, since performing the rooted training includes performing a check on all the training codes, the controller 110 may spend a lot of time in performing the rooted training.

Figure 8:
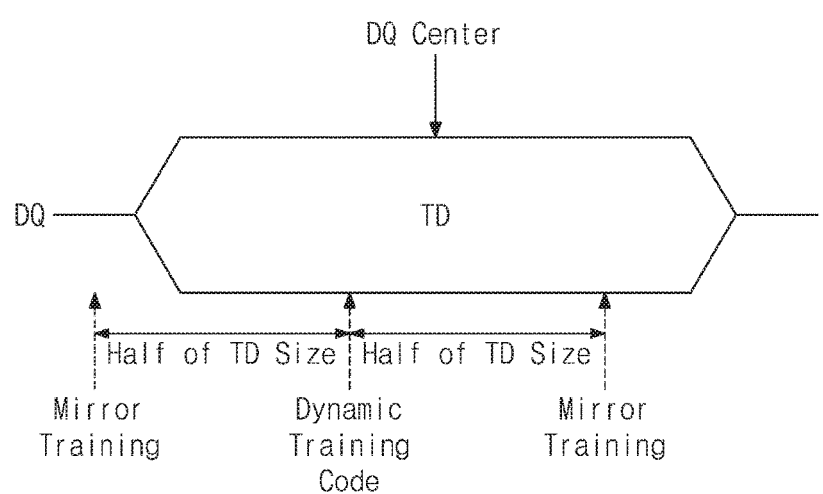
FIG. 8 is a view illustrating a mirror training according to some example embodiments of the inventive concepts.

FIG. 8 is a view illustrating a mirror training according to some example embodiments of the inventive concepts.

Referring to FIG. 8, when performing the mirror training, the controller 110 may read a dynamic training code stored in the nonvolatile memory device 120. For example, the dynamic training code may include center information of the data signal DQ according to a result of a previously performed training operation. The controller 110 may search the data signal DQ at a specific distance (e.g., half of the training data (TD) size) away from the dynamic training code. According to a search result, the controller 110 may change a searching location from the dynamic training code by a specific space to repeatedly perform the training operation. The controller 110 may find the center of the data signal DQ through performing the mirror training, Since performing the mirror training includes fewer search operations than performing the rooted training, the time taken by the controller 110 to perform the mirror training may be shorter than the time taken to perform the rooted training.

Figure 9:
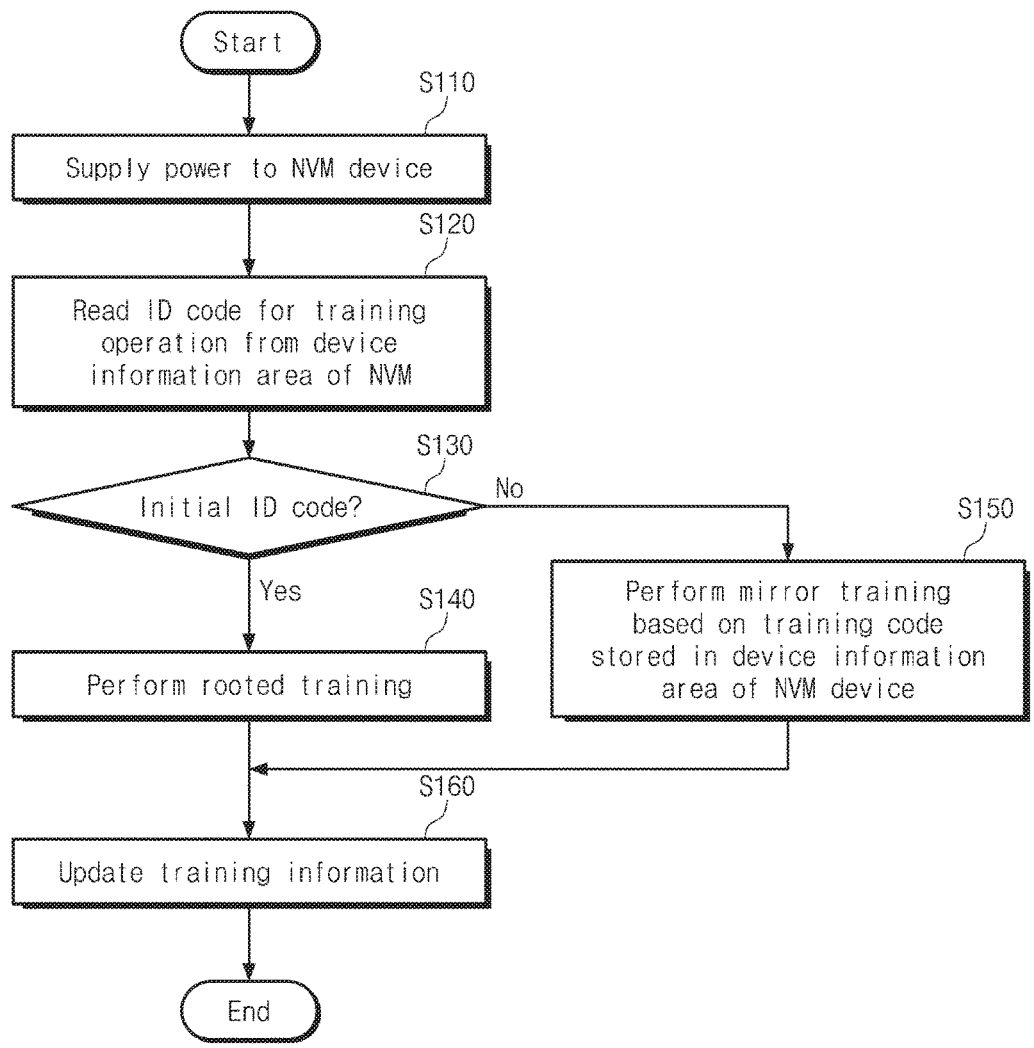
FIG. 9 is a flowchart illustrating a training operation method according to some example embodiments of the inventive concepts.

FIG. 9 is a flowchart illustrating a training operation method according to some example embodiments of the inventive concepts.

Referring to FIG. 9, the memory system 100 may selectively perform a training operation based on the identification code stored in the nonvolatile memory device 120.

In an operation S110, the memory system 100 may supply power to the nonvolatile memory device 120. For example, when supplying power to the nonvolatile memory device 120, a training operation may be performed by the controller 110. The training operation may be periodically performed by the controller 110 during an operation of the memory system 100.

In an operation S120, the controller 110 may read training information from a device information area of the nonvolatile memory device 120. For example, the training information may be stored in the device information area of the nonvolatile memory device 120. The device information area of the nonvolatile memory device 120 may store data for an operation of the memory system 100 and internal configuration setting data of the nonvolatile memory device 120, and the device information area may not be accessible by the host. The training information may include an identification code and a dynamic training code.

In an operation S130, the controller 110 may determine whether the identification code is an initial identification code or a post identification code. For example, when the identification code is the initial identification code, the training management unit 113 may perform a rooted training (the procedure goes to an operation S140). On the other hand, when the identification code is the post identification code, the training management unit 113 may perform a mirror training (the procedure goes to an operation S150).

In the operation S140, the controller 110 may perform the rooted training. For example, the controller 110 may generate a rooted training code including all training codes within a training range. When the identification code is the initial identification code, the controller 110 may perform the rooted training over all sections of the data signal DQ using the rooted training code.

In the operation S150, the controller 110 may perform the mirror training based on the dynamic training code stored in the device information area of the nonvolatile memory device 120. For example, the controller 110 may perform the mirror training using the dynamic training code included in the training information read in the operation S120.

In an operation S160, the controller 110 may update the training information. After performing either of the rooted training and/or the mirror training, the training management unit 113 may store a new dynamic training code in the device information area of the nonvolatile memory device 120. After performing the rooted training, the training management unit 113 may also store the post identification code for performing the mirror training in the device information area of the nonvolatile memory device 120. The training management unit 113 may change the post identification code to the initial identification code based on a command received from the host.

The memory system 100 may store the training information in the device information area of the nonvolatile memory device 120. The memory system 100 may selectively perform either of the rooted training and/or the mirror training according to the training information. The memory system 100 may secure an optimal (or desired) reliability through the rooted training. However, if the rooted training is performed all the time, an operation speed of the memory system 100 may be reduced. Thus, the memory system 100 may reduce a training operation time by selectively performing either of the rooted training and/or the mirror training.

Figure 10:
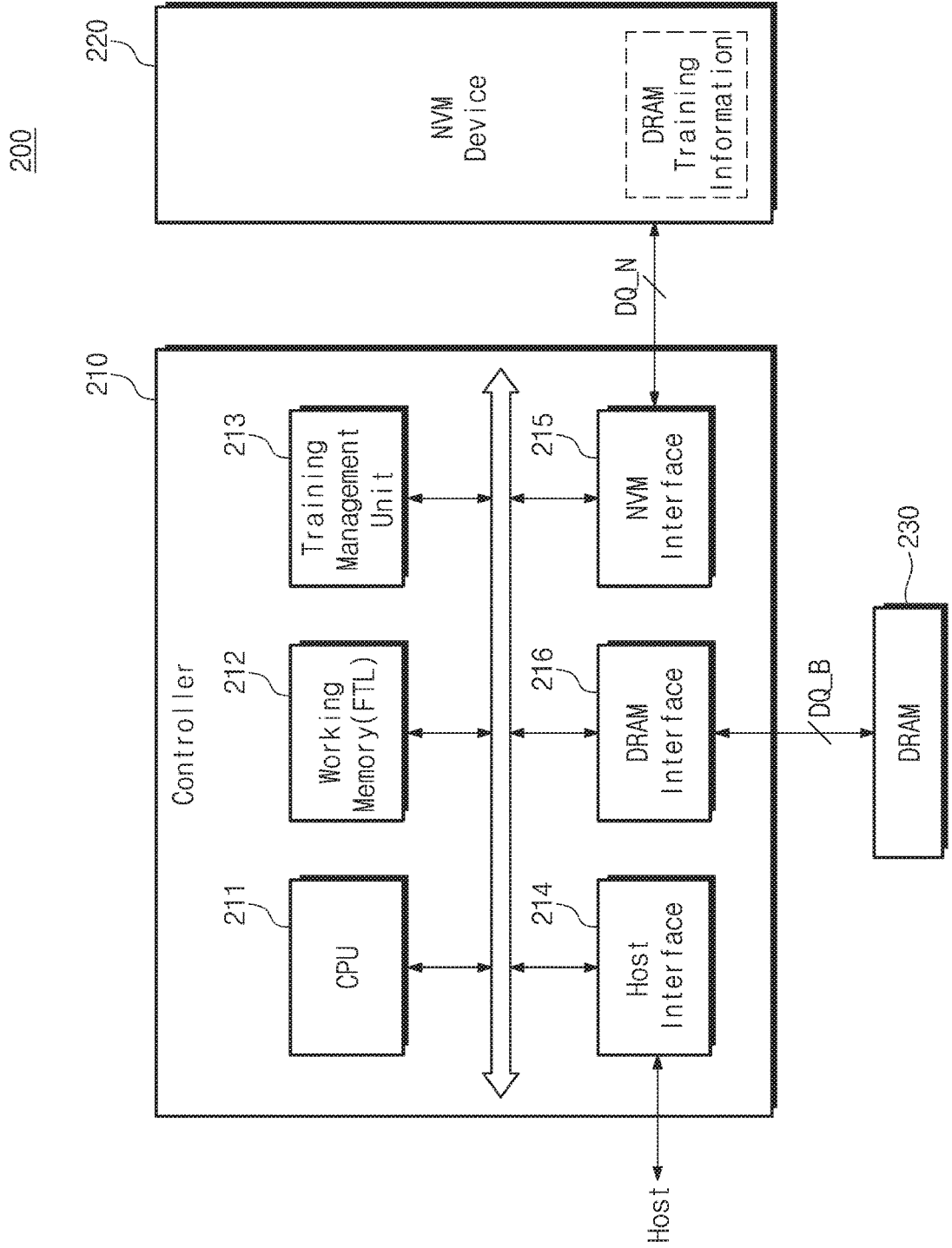
FIG. 10 is a block diagram illustrating a memory system according to some other example embodiments of the inventive concepts.

FIG. 10 is a block diagram illustrating a memory system according to some other example embodiments of the inventive concepts.

Referring to FIG. 10, the memory system 200 may include a controller 210, a nonvolatile memory device 220, and a dynamic random access memory 230. The controller 210 and the nonvolatile memory device 220 may exchange a plurality of data signals DQ_N with each other through a channel. The channel may include a plurality of transmission lines and each transmission line may transmit each data signal DQ_N, respectively. The memory system 200 may periodically perform a training operation to maintain an optimal (or desired) reliability of the data signals DQ_N. The controller 210 and the dynamic random access memory 230 may exchange a plurality of data signals DQ_B with each other through a channel. The memory system 200 may periodically perform a DRAM training operation to maintain an optimal (or desired) reliability of the data signals DQ_B.

The controller 210 may include a central processing unit (CPU) 211, a working memory 212, a training management unit 213, a host interface 214, a nonvolatile memory interface 215, and a dynamic random access memory interface 216 (hereinafter referred to as a DRAM interface). However, configuration elements of the controller 210 are not limited thereto. For example, the controller 210 may further include a ROM storing code data necessary for an initial booting operation, an error correction unit (ECC) recovering damaged data, SDRAM, etc. The controller 210 may have a configuration which is the same as or similar to that of the controller 110 of FIG. 1. Thus, overlapping contents described above are omitted.

The DRAM interface 216 may control an access operation (e.g., read/write/erase operations) of the dynamic random access memory 230 in response to a control of the CPU 211. The dynamic random access memory 230 may perform a function of temporarily storing data transmitted between the nonvolatile memory device 220 and the host. For example, the DRAM interface 216 may exchange a plurality of data signals DQ_B with the dynamic random access memory 230.

Various processing circuitry may be configured, through a layout design and/or execution of computer-readable instructions stored in a memory (e.g., a non-transitory computer-readable storage medium), as a special purpose computer to perform the functions of the controller 210 (and the sub-components thereof). In some example embodiments, the CPU 211 may be programmed with instructions that configure the CPU 211 to perform the functions of the training management unit 213. In some other example embodiments, the training management unit 213 (and processing circuitry included therein) may include discrete hardware circuitry, such as one or more application-specific integrated circuits (ASICs), designed to perform the functions of the training management unit 213 and the processing circuitry included therein).

The training management unit 213 may manage a DRAM training operation of the data signals DQ_B between the DRAM interface 216 and the dynamic random access memory 230. The DRAM training operation may include a DRAM rooted training and a DRAM mirror training. Performing the DRAM rooted training may include the training management unit 213 searching all sections of the data signal DQ_B to find an optimum (or desired) timing skew. Since the training management unit 213 searches all sections of the data signal DQ_B in performing the DRAM rooted training, an optimal (or desired) reliability of the data signal DQ_B may be secured. However, it may take a lot of time for the training management unit 213 to search all the sections of the data signal DQ_B. The DRAM rooted training may be called a full training. Performing the DRAM mirror training may include the training management unit 213 searching a specific point in time of the data signal DQ_B using DRAM training information stored in advance. Thus, performing the DRAM mirror training may shorten a length of time spent by the training management unit 213 in performing the training operation. The training management unit 213 may store DRAM training information obtained through a previously performed DRAM training operation in the nonvolatile memory device 220. Thus, when the DRAM training information is stored, the controller 210 may rapidly perform the DRAM training operation using the stored DRAM training information. The DRAM rooted training may be performed in a manner similar to the rooted training described in FIG. 7. The DRAM mirror training may be performed in a manner similar to the mirror training described in FIG. 8.

The DRAM training information may be stored in a device information area of the nonvolatile memory device 220. For example, the nonvolatile memory device 220 may include a data area and the device information area. The data area may store data received from the host and may be accessed by the host. The device information area may store data for an operation of the memory system 200 and internal configuration setting data of the nonvolatile memory device 220, and the device information area may not be accessible by the host.

When the memory system 200 performs the DRAM training operation, the training management unit 213 may read the DRAM training information stored in the nonvolatile memory device 220. The DRAM training information may include a DRAM identification code and a DRAM dynamic training code. The DRAM identification code may indicate whether to perform the DRAM rooted training. When the DRAM identification code is an initial DRAM identification code, the training management unit 213 may perform the DRAM rooted training. When the DRAM identification code is a post DRAM identification code, the training management unit 213 may perform the DRAM mirror training. When performing the DRAM mirror training, the training management unit 213 may perform the DRAM training operation using the DRAM dynamic training code stored in the device information area of the nonvolatile memory device 220. Thus, the DRAM mirror training may be performed by the training management unit 213 in a shorter amount of time as compared to the DRAM rooted training. The training management unit 213 may update the DRAM dynamic training code after performing either of the DRAM rooted training and/or the DRAM mirror training.

The memory system 200 may store the DRAM training information in the device information area of the nonvolatile memory device 220. The memory system 200 may selectively perform either of the DRAM rooted training and/or the DRAM mirror training according to the DRAM training information. The memory system 200 may rapidly perform not only a training operation of the nonvolatile memory device 220 but also a DRAM training operation of the dynamic random access memory 230 using the DRAM training information of the dynamic random access memory 230.

Figure 11:
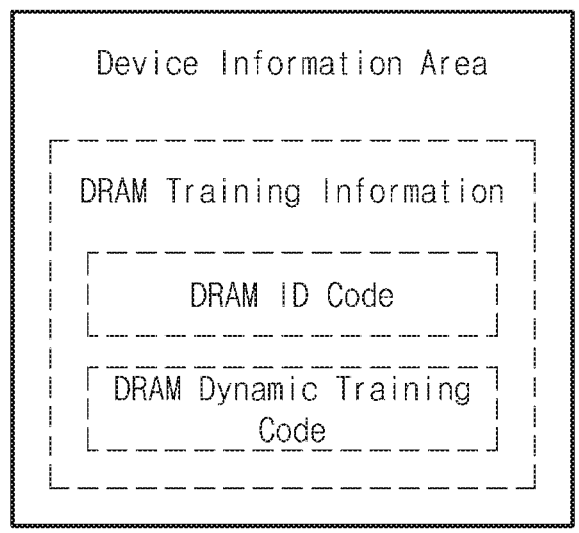
FIG. 11 is a view illustrating a device information area of a nonvolatile memory device according to some other example embodiments of the inventive concepts.

FIG. 11 is a view illustrating a device information area of a nonvolatile memory device according to some other example embodiments of the inventive concepts.

Referring to FIG. 11, the DRAM training information of the dynamic random access memory 230 may be stored in the device information area of the nonvolatile memory device 220. The device information area may store data for an operation of the memory system 200 and internal configuration setting data of the nonvolatile memory device 220, and the device information area may not be accessible by the host.

The DRAM training information may include a DRAM identification code and a DRAM dynamic training code. The DRAM identification code may indicate whether to perform the DRAM rooted training. When the DRAM identification code is the initial DRAM identification code, the training management unit 213 may perform the DRAM rooted training. When the identification code is the post DRAM identification code, the training management unit 213 may perform the DRAM mirror training. When performing the DRAM mirror training, the training management unit 213 may perform the DRAM training operation using the DRAM dynamic training code stored in the nonvolatile memory device 220.

After performing the DRAM training operation, the training management unit 213 may update the DRAM dynamic training code to a new training code. For example, the training management unit 213 may store the post DRAM identification code for performing the DRAM mirror training in the device information area after performing the DRAM rooted training. The training management unit 213 may store a new DRAM dynamic training code that reflects a result of the DRAM training operation in the device information area. Thus, when performing a next DRAM training operation, the controller 210 may rapidly perform the DRAM training operation of the dynamic random access memory 230 using the updated DRAM dynamic training code.

Figure 12:
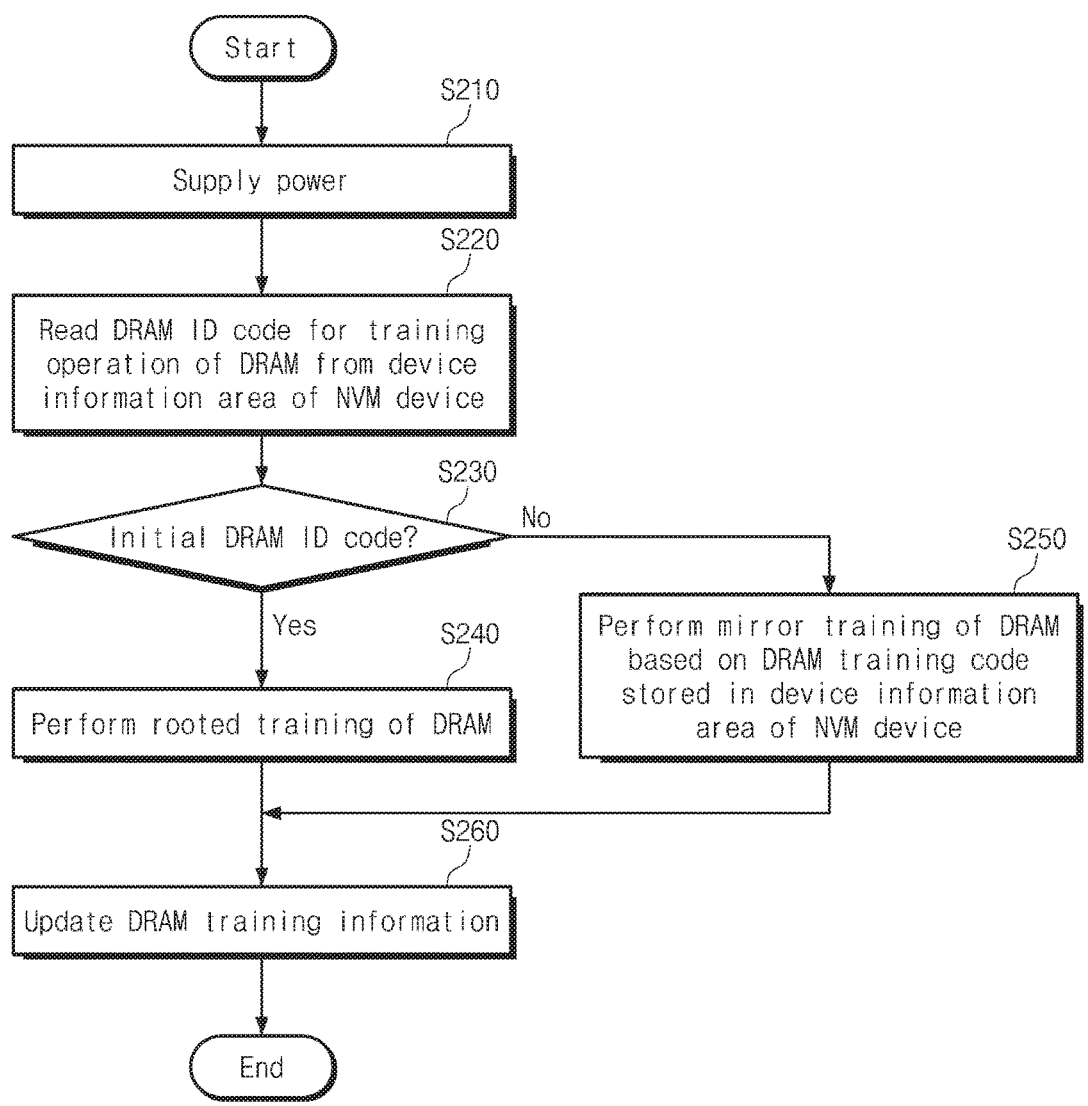
FIG. 12 is a flowchart illustrating a training operation method according to some other example embodiments of the inventive concepts.

FIG. 12 is a flowchart illustrating a training operation method according to some other example embodiments of the inventive concepts.

Referring to FIG. 12, the memory system 200 may selectively perform a training operation of the dynamic random access memory 230 based on the DRAM identification code stored in the nonvolatile memory device 220.

In an operation S210, the memory system 200 may supply power to the nonvolatile memory device 220 and the dynamic random access memory 230. For example, when power is supplied to the memory system 200, a DRAM training operation may be performed by the controller 210. The DRAM training operation may be periodically performed by the controller 210 during an operation of the memory system 200.

In an operation S220, the controller 210 may read DRAM training information from a device information area of the nonvolatile memory device 220. For example, the DRAM training information may be stored in the device information area of the nonvolatile memory device 220. The device information area of the nonvolatile memory device 220 stores data for an operation of the memory system 200 and internal configuration setting data of the nonvolatile memory device 220, and the device information area may not be accessible by the host. The DRAM training information may include a DRAM identification code and a DRAM dynamic training code.

In an operation S230, the controller 210 may determine whether the DRAM identification code is an initial DRAM identification code or a post DRAM identification code. For example, when the DRAM identification code is the initial DRAM identification code, the training management unit 213 may perform a DRAM rooted training (the procedure goes to an operation S240). On the other hand, when the DRAM identification code is the post DRAM identification code, the training management unit 213 may perform a DRAM mirror training (the procedure goes to an operation S250).

In the operation S240, the controller 210 may perform the DRAM rooted training. For example, the controller 210 may generate a DRAM rooted training code (a DRAM beginning training code). When the DRAM identification code is the initial DRAM identification code, the controller 210 may perform the DRAM rooted training over all sections of the data signal DQ_B using the DRAM rooted training code (the DRAM beginning training code).

In the operation S250, the controller 210 may perform the DRAM mirror training based on the DRAM dynamic training code stored in the device information area of the nonvolatile memory device 220. For example, the controller 210 may perform the DRAM mirror training using the DRAM dynamic training code included in the DRAM training information read in the operation S220.

In an operation S260, the controller 210 may update the DRAM training information. After performing either of the DRAM rooted training and/or the DRAM mirror training, the training management unit 213 may store a new DRAM dynamic training code in the device information area of the nonvolatile memory device 220. After performing the DRAM rooted training, the training management unit 213 may also store the post DRAM identification code for performing the DRAM mirror training in the device information area of the nonvolatile memory device 220. The training management unit 213 may change the post DRAM identification code to the initial DRAM identification code again based on a command received from the host.

The memory system 200 may store the DRAM training information in the device information area of the nonvolatile memory device 220. The memory system 200 may selectively perform either of the DRAM rooted training of the dynamic random access memory 230 and/or the DRAM mirror training of the dynamic random access memory 230.

Figure 13:
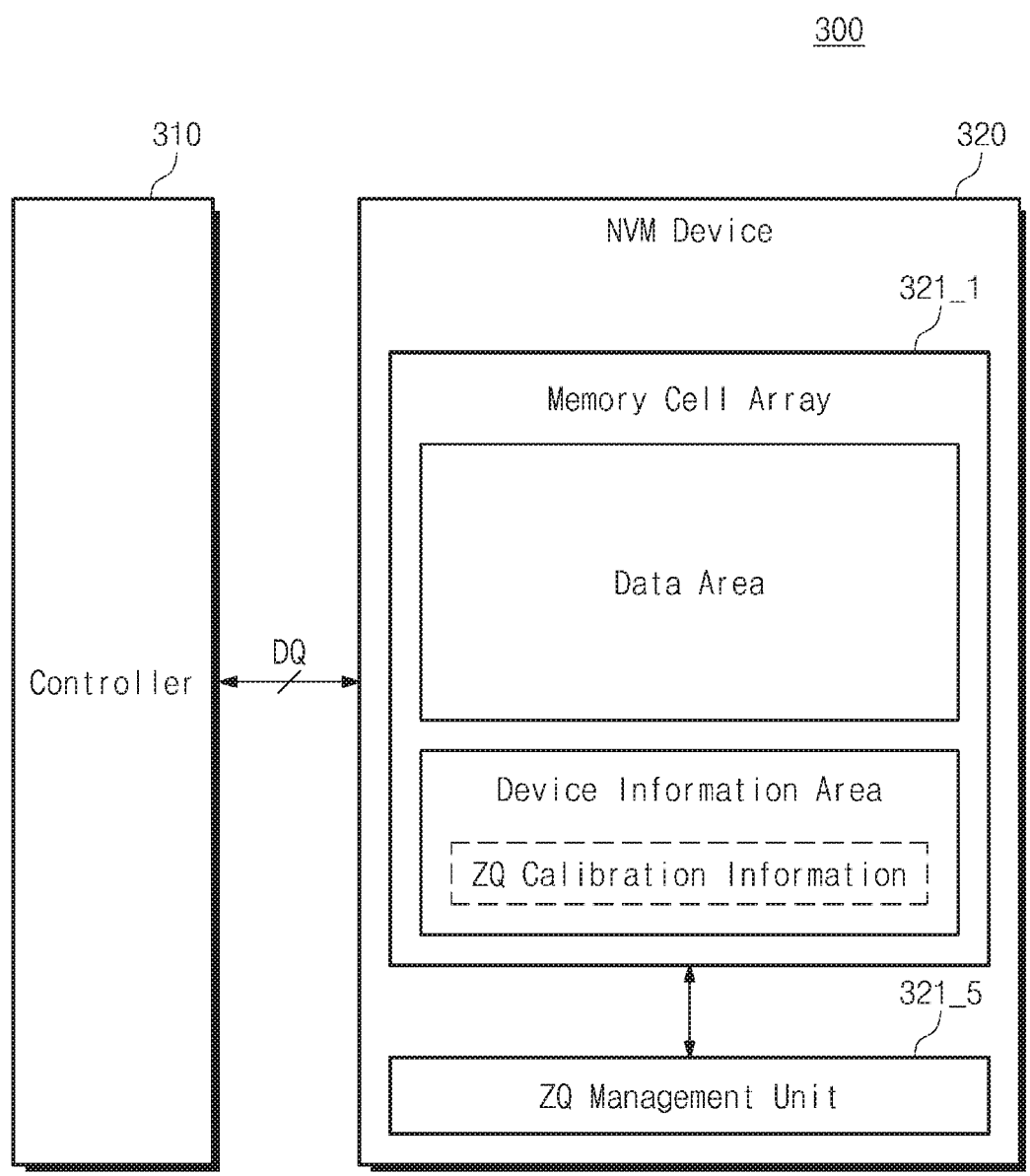
FIG. 13 is a block diagram illustrating a memory system according to some other example embodiments of the inventive concepts.

FIG. 13 is a block diagram illustrating a memory system according to some other example embodiments of the inventive concepts.

Referring to FIG. 13, the memory system 300 may include a controller 310 and a nonvolatile memory device 320. A configuration of the memory system 300 may be similar to the configurations of the memory systems 100 and 200 of FIGS. 1 and 10. Thus, the description of overlapping configurations is omitted.

The nonvolatile memory device 320 may include a ZQ management unit 321_5. Various processing circuitry may be configured, through a layout or design and/or execution of computer-readable instructions stored in a memory (e.g., a non-transitory computer-readable storage medium), as a special purpose computer to perform the functions of the ZQ management unit 321_5. In some example embodiments, a CPU (not shown in FIG. 13) may be programmed with instructions that configure the CPU (not shown) to perform the functions of the ZQ management unit 321_5 (and processing circuitry included therein). In some other example embodiments, the ZQ management unit 321_5 may include discrete hardware circuitry, such as one or more application-specific integrated circuits (ASICs), designed to perform the functions of the ZQ management unit 321_5 (and the processing circuitry included therein).

For example, the ZQ management unit 321_5 may perform a ZQ calibration operation of the nonvolatile memory device 320. The ZQ management unit 321_5 may store ZQ calibration information of the nonvolatile memory device 320 in a device information area of a memory cell array 321_1. Thus, the ZQ management unit 321_5 may rapidly perform the ZQ calibration operation using the ZQ calibration information stored in the device information area.

Figure 14:
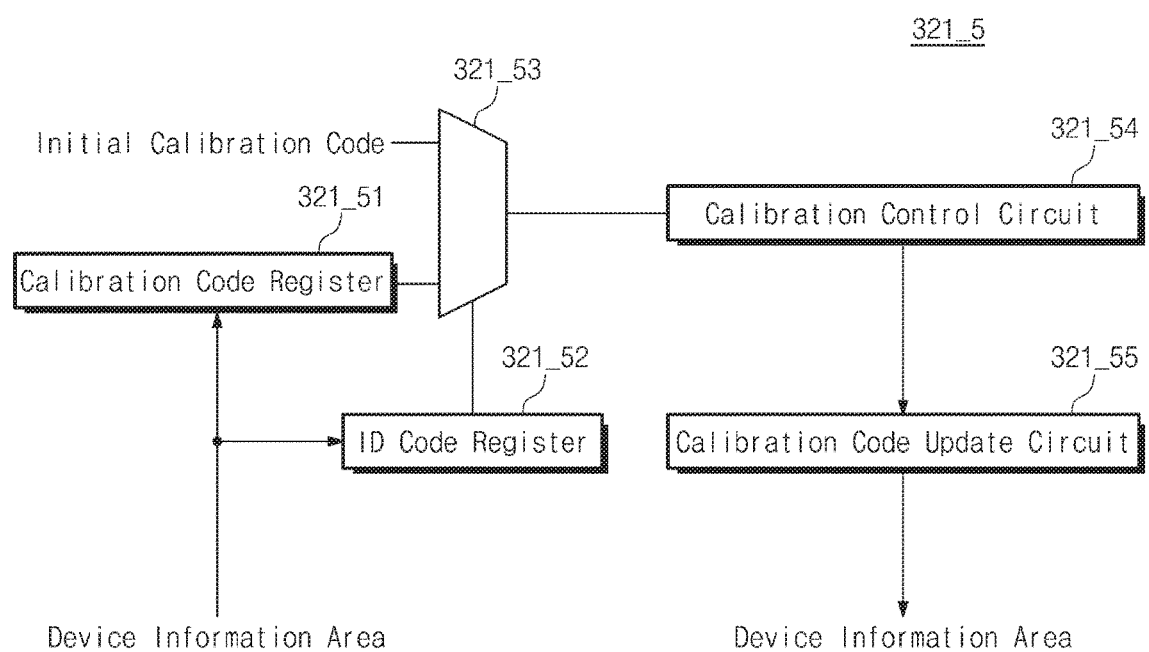
FIG. 14 is a block diagram illustrating a training management unit of FIG. 13 according to some other example embodiments of the inventive concepts.

FIG. 14 is a block diagram illustrating the ZQ management unit 321_5 of FIG. 13 according to some other example embodiments of the inventive concepts.

Referring to FIG. 14, the ZQ management unit 321_5 may include a calibration code register 321_51, an identification code register 321_52, a multiplexer 321_53, a calibration control circuit 321_54, and a calibration code update circuit 321_55.

In some example embodiments, a CPU (not shown in FIG. 14) may be programmed with instructions that configure the CPU (not shown) to perform the functions of the calibration control circuit 321_54 and the calibration code update circuit 321_55. In some other example embodiments, the calibration control circuit 321_54 and the calibration code update circuit 321_55 may include discrete hardware circuitry, such as one or more application-specific integrated circuits (ASICs), designed to perform the functions of the calibration control circuit 321_54 and the calibration code update circuit 321_55, respectively.

The calibration control circuit 321_54 may perform the ZQ calibration operation based on code data received from the multiplexer 321_53. For example, in the ZQ calibration operation, the ZQ management unit 321_5 may read a ZQ identification code from the device information area of the memory cell array 321_1 to store the read ZQ identification code in the identification code register 321_52. In the ZQ calibration operation, the ZQ management unit 321_5 may read a ZQ dynamic calibration code from the device information area of the memory cell array 321_1 to store the read ZQ dynamic calibration code in the calibration code register 321_51.

When the ZQ identification code is an initial ZQ identification code, the multiplexer 321_53 may output a ZQ initial calibration code generated by the ZQ management unit 321_5 (a ZQ beginning calibration code). The calibration control circuit 321_54 may perform the ZQ calibration operation according to the ZQ initial calibration code (the ZQ beginning calibration code).

When the ZQ identification code is a post ZQ identification code, the multiplexer 321_53 may output the ZQ dynamic calibration code stored in the calibration code register 321_51. The calibration control circuit 321_54 may perform the ZQ calibration operation according to the ZQ dynamic calibration code.

After the ZQ calibration operation is completed, the calibration control circuit 321_54 may transmit a result of the ZQ calibration operation to the calibration code update circuit 321_55. The calibration code update circuit 321_55 may store a new ZQ dynamic calibration code in the device information area of the nonvolatile memory device 320 as the ZQ dynamic calibration code based on the result of the ZQ calibration operation. After performing the ZQ calibration operation according to the ZQ initial calibration code (the ZQ beginning calibration code), the calibration code update circuit 321_55 may store the post ZQ identification code in the device information area of the nonvolatile memory device 320. Thus, in a next ZQ calibration operation after performing the ZQ calibration operation according to the ZQ initial calibration code (the ZQ beginning calibration code), a ZQ calibration operation according to the updated ZQ dynamic calibration code may be rapidly performed by the calibration control circuit 321_54. The calibration code update circuit 321_55 pray also change the post ZQ identification code to the initial ZQ identification code again based on a command received from a host.

Figure 15:
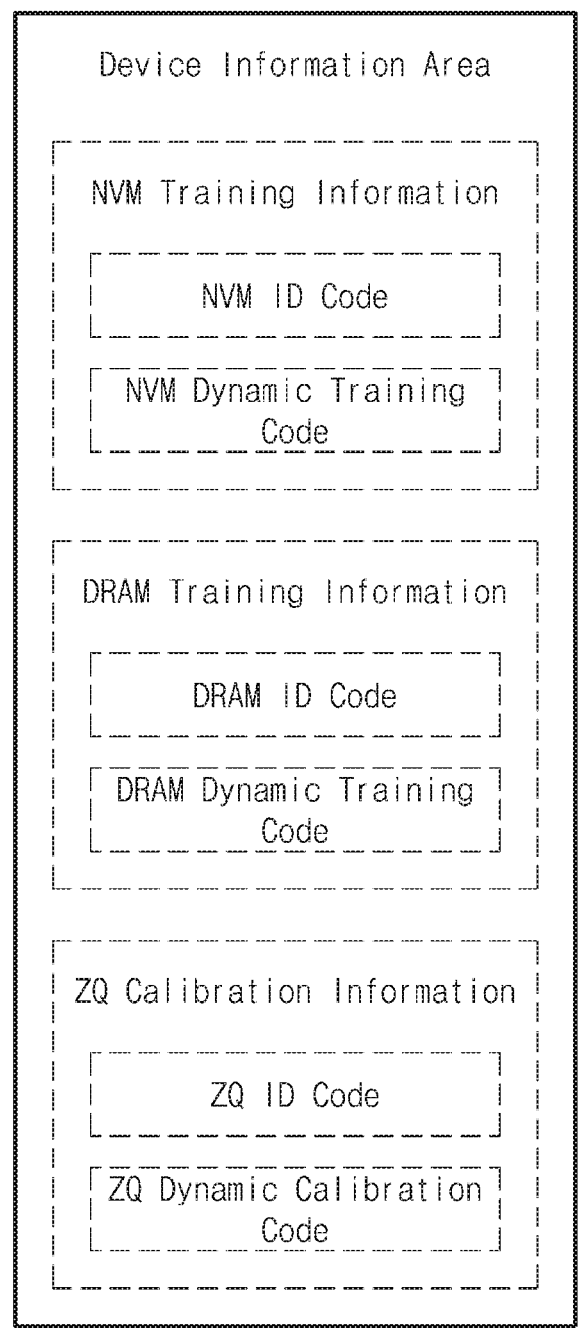
FIG. 15 is a view illustrating a device information area of a nonvolatile memory device according to other example embodiments of the inventive concepts.

FIG. 15 is a view illustrating a device information area of a nonvolatile memory device according to some other example embodiments of the inventive concepts.

Referring to FIG. 15, NVM training information, DRAM training information, and ZQ calibration information may be stored in the device information area of the nonvolatile memory device. Thus, the memory system may rapidly perform one or more of an NVM training operation of the nonvolatile memory device, a DRAM training operation of the dynamic random access memory, and/or a ZQ calibration operation using the information stored in the device information area of the nonvolatile memory device.

Figure 16:
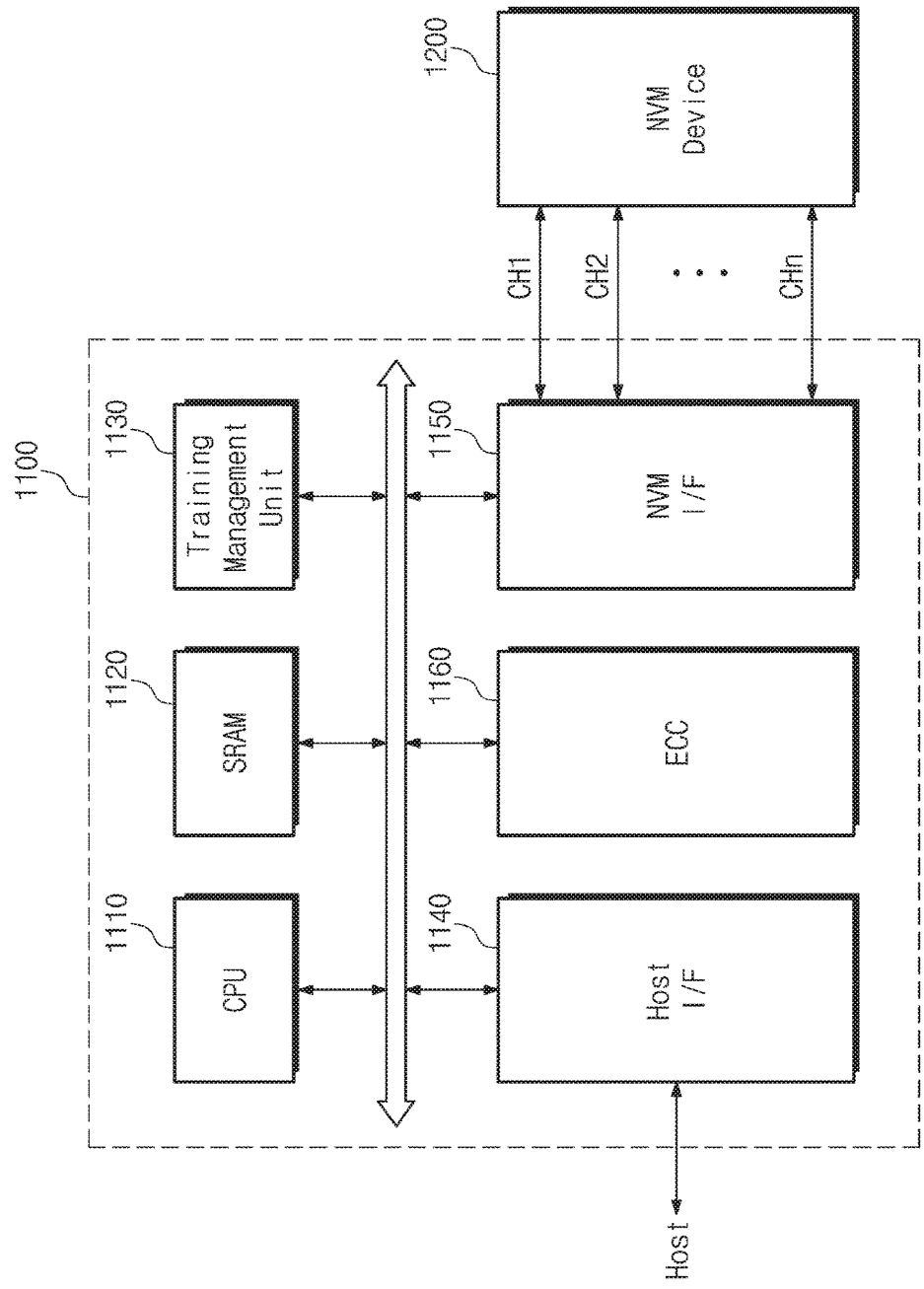
FIG. 16 is a block diagram illustrating a memory system according to some example embodiments of the inventive concepts.

FIG. 16 is a block diagram illustrating a memory system according to some example embodiments of the inventive concepts.

Referring to FIG. 16, the memory system 1000 may include a memory controller 1100 and a nonvolatile memory device 1200.

The memory controller 1100 may be configured to control the nonvolatile memory device 1200. The memory system 1000 may be provided as a memory card or a solid state drive (SSD) by a combination of the memory controller 1100 and the nonvolatile memory device 1200. An SRAM 1120 may be used as a working memory of a central processing unit (CPU) 1110. A host interface 1140 may include data exchange protocols of a host connected to the memory system 1000. A memory interface 1150 may interface with the nonvolatile memory device 1200. The memory interface 1150 may be connected to the nonvolatile memory device 1200 through a plurality of channels. An error correction block 1160 may detect and correct errors included in data read from the nonvolatile memory device 1200. The CPU 1110 may perform an overall control operation for a data exchange of the memory controller 1100. Although not illustrated in the drawing, the memory system 1000 may further include a ROM (not shown) storing code data for an interface with the host.

A training management unit 1130 of the memory controller 1100 may be the same as or similar to the training management unit described in FIGS. 1 through 12. In some example embodiments, the CPU 1110 may be programmed with instructions that configure the CPU 1110 to perform the functions of the training management unit 1130. In some other example embodiments, the training management unit 1130 (and processing circuitry included therein) may include discrete hardware circuitry, such as one or more application-specific integrated circuits (ASICs), designed to perform the functions of the training management unit 1130 (and the processing circuitry included therein). The training management unit 1130 may store training information in a device information area of the nonvolatile memory device 1200. The training management unit 1130 may selectively perform either of a rooted training and/or a mirror training according to the training information. Thus, the training management unit 1130 may reduce a training operation time by selectively performing either of the rooted training and/or the mirror training.

The nonvolatile memory device 1200 may perform the ZQ calibration operation described in FIGS. 13 through 15.

For example, the nonvolatile memory device 1200 may store ZQ calibration information in the device information area and may perform the ZQ calibration operation based on the stored ZQ calibration information. The nonvolatile memory device 1200 may be provided as a multi-chip package constituted by a plurality of flash memory chips. The memory system 1000 may be provided as storage medium having high reliability where the probability of error occurrence is low. A memory system such as a solid state drive (SSD) may include a flash memory device. In this case, the memory controller 1100 may be configured to communicate with the outside through one of various interface protocols such as USB, MMC, PCI-E, SAS, SATA, PATA, SCSI, ESDI, and IDE.

Figure 17:
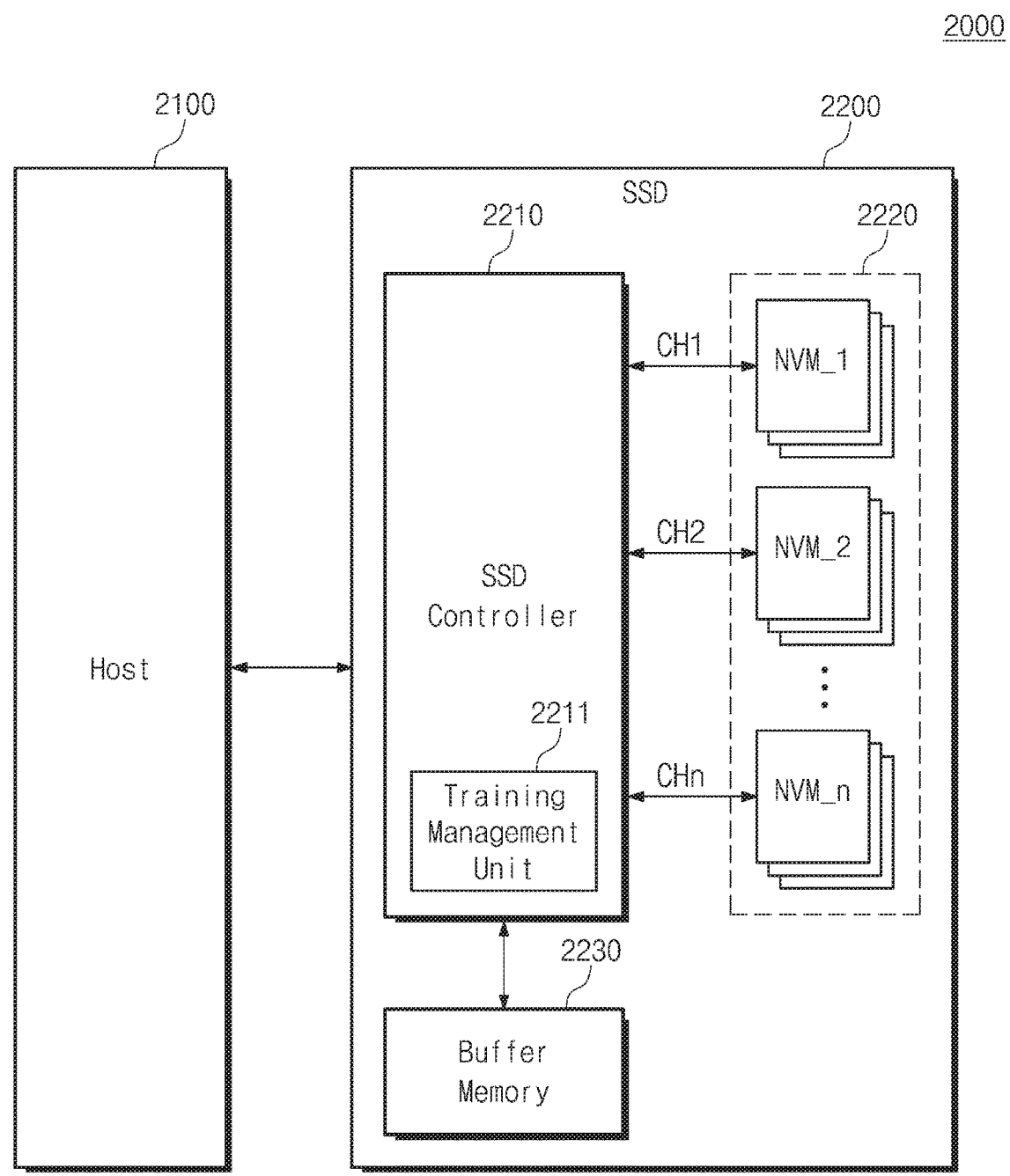
FIG. 17 is a block diagram illustrating an SSD system according to some example embodiments of the inventive concepts.

FIG. 17 is a block diagram illustrating an SSD system according to some example embodiments of the inventive concepts.

Referring to FIG. 17, an SSD system 2000 may include a host 2100 and a solid state drive (SSD) 2200. The SSD 2200 may include an SSD controller 2210, a nonvolatile memory device 220, and a buffer memory 2230.

The SSD controller 2210 may provide a physical connection with the SSD 2200. That is, the SSD controller 2210 may provide an interface with the SSD 2200 in response to a bus format of the host 2100. The SSD controller 2210 may decode a command provided from the host 2100. According to a decoding result, the SSD controller 2210 may access the nonvolatile memory device 2220. Examples of the bus format of the host 2100 may include a universal serial bus (USB), a small computer system interface (SCSI), a PCI express, an advanced technology attachment (ATA), a parallel ATA, a serial ATA, a serial attached SCSI (SAS), etc.

A training management unit 2211 of the SSD controller 2210 may be the same as or similar to the training management unit described in FIGS. 1 through 12. Various processing circuitry may be configured, through a layout or design and/or execution of computer-readable instructions stored in a memory (e.g., a non-transitory computer-readable storage medium), as a special purpose computer to perform the functions of the training management unit 2211. In some example embodiments, a CPU (not shown in FIG. 17) may be programmed with instructions that configure the CPU (not shown) to perform the functions of the training management unit 2211 (and processing circuitry included therein). In some other example embodiments, the training management unit 2211 may include discrete hardware circuitry, such as one or more application-specific integrated circuits (ASICs), designed to perform the functions of the training management unit 2211 (and the processing circuitry included therein).

The training management unit 2211 may store training information in a device information area of the nonvolatile memory device 2220. The training management unit 2211 may selectively perform either of a rooted training and/or a mirror training according to the training information. Thus, the training management unit 2211 may reduce a training operation time by selectively performing either of the rooted training and/or the mirror training. The training management unit 2211 may perform a training operation with respect to each of a plurality of channels. The training management unit 2211 may perform the training operation of the nonvolatile memory device 2220 and the buffer memory 2230.

The nonvolatile memory device 2220 may perform the ZQ calibration operation described in FIGS. 13 through 15. For example, the nonvolatile memory device 2220 may store ZQ calibration information in the device information area and may perform the ZQ calibration operation based on the stored ZQ calibration information. The nonvolatile memory device 2220 may be provided as a storage medium of the SSD 2200. For example, the nonvolatile memory device 2220 may be provided as a NAND-type flash memory having high storage capacity. The nonvolatile memory device 2220 may be constituted by a plurality of memory devices. In this case, each memory device may be connected to the SSD controller 2210 on a per-channel basis. A NAND-type flash memory is described as a non-limiting example embodiment of a storage medium, but various other nonvolatile memory devices may similarly (alternatively or additionally) be used as a storage medium. For example, a PRAM, a MRAM, a ReRAM, a FRAM, a NOR flash memory, etc. may be used as a storage medium, and a memory system in which different kinds of memory devices are mixed may be applied. In some example embodiments, a volatile memory device (e.g., DRAM) may also be included as a storage medium.

The buffer memory 2230 may temporarily store write data provided from the host 2100 or data read from the nonvolatile memory device 2220. When data that exists in the nonvolatile memory device 2220 is cached when a read request is received from the host 2100, the buffer memory 2230 may support a function of directly providing the cached data to the host 2100. A data transmission speed by the bus format (e.g., SATA or SAS) of the host 2100 may be much faster than a transmission speed of the memory channel of the SSD 2200. That is, when an interface speed of the host 2100 is very fast, performance degradation caused by a speed difference may be minimized or reduced by providing the large-capacity buffer memory 2230.

The buffer memory 2230 may be provided as a synchronous DRAM to provide a sufficient buffeting in the SSD 2200 used as a large-capacity auxiliary memory device. However, it is apparent to those skilled in the art that the buffer memory 2230 is not limited thereto.

Figure 18:
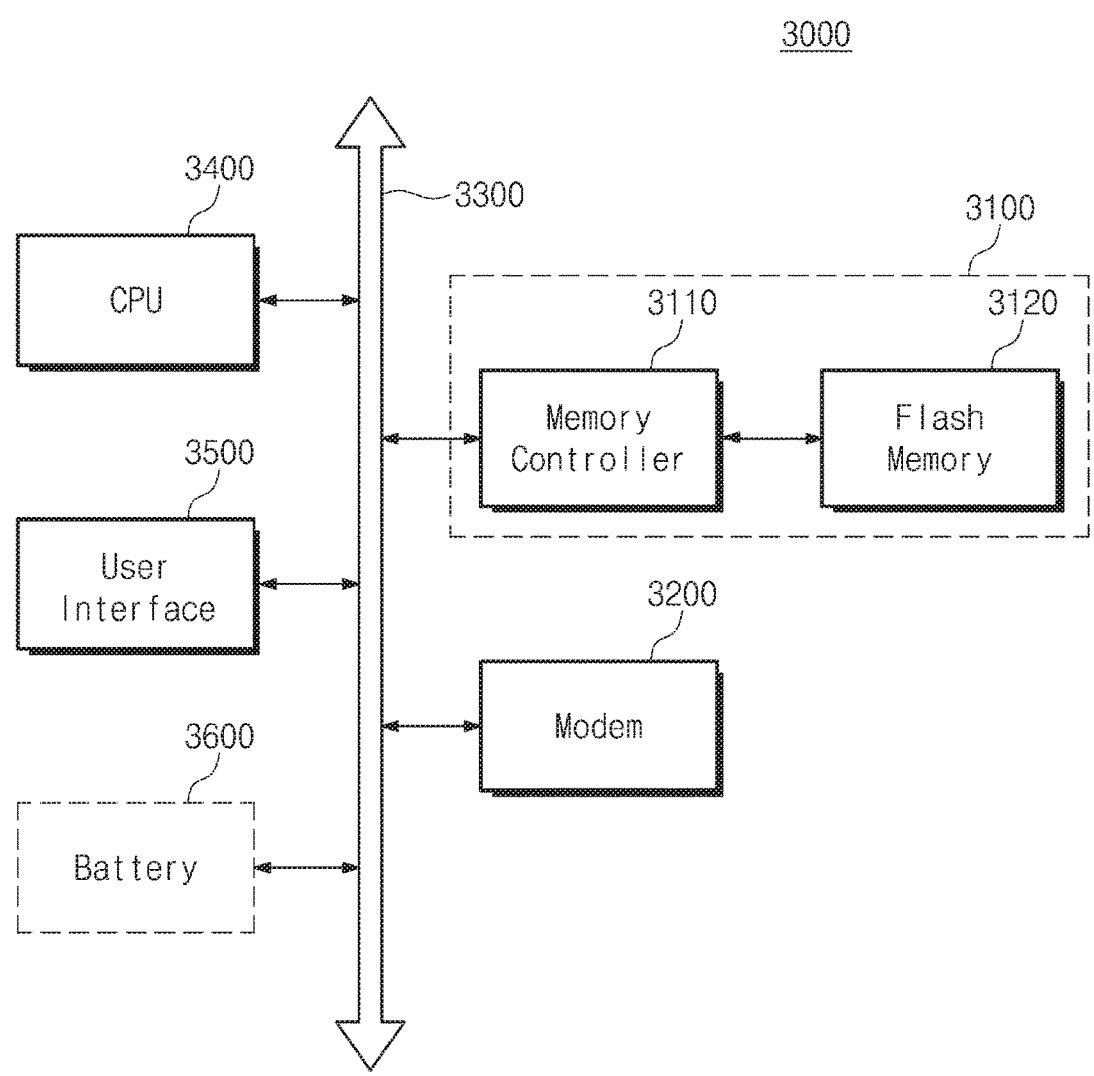
FIG. 18 is a block diagram illustrating a computing system according to some other example embodiments of the inventive concepts.

FIG. 18 is a block diagram illustrating a computing system according to some other example embodiments of the inventive concepts.

Referring to FIG. 18, the computing system 3000 may include a nonvolatile storage device 3100, a central processing unit (CPU) 3400, a user interface 3500, and a modem 3200 (such as a baseband chipset) that may be electrically connected to a system bus 3300. A configuration of the nonvolatile storage device 3100 may be substantially the same as or similar to the memory system 100 illustrated in FIG. 1.

When the computing system 3000 is a mobile device, a battery 3600 may be additionally provided to supply an operation voltage of the computing system 3000. Although not illustrated in the drawing, the computing system 3000 may further include an application chipset, a camera image processor (CIS), a mobile DRAM, etc.

The nonvolatile storage device 3100 may include the training management unit and the ZQ calibration unit described in FIGS. 1 through 15. For example, the nonvolatile storage device 3100 may include a memory controller 3110 configured to perform the functions of the training management unit and the ZQ calibration unit described in FIGS. 1 through 15. The nonvolatile storage device 3100 may store training information in a device information area of the flash memory 3120. The nonvolatile storage device 3100 may selectively perform either of a rooted training and/or a mirror training according to the training information. Thus, the nonvolatile storage device 3100 may reduce a training operation time by selectively performing either of the rooted training and/or the mirror training. The flash memory 3120 may store ZQ calibration information in the device information area, and the memory controller 3110 may perform a ZQ calibration operation based on the stored ZQ calibration information.

The nonvolatile memory device(s) and/or the memory controller(s) according to various example embodiments of the inventive concepts may be mounted in various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFO), thin quad flat pack (TQFP), small outline (SOIC), shrink small outline package (SSOP), thin small outline (TSOP), thin quad flatpack (TQFP), system in package (SIP), multi-chip package (MCP), water-level fabricated package (WFP) and wafer-level processed stack package (WSP).

A memory system according to some example embodiments of the inventive concepts may store training information in a device information area of a nonvolatile memory device and may selectively perform various modes of a training operation according to the stored training information. Thus, the time taken by the memory system to perform the training operation may be reduced.

The contents described above are non-limiting specific example embodiments for implementing the inventive concepts. The inventive concepts may include not only the example embodiments described above, but also other example embodiments in which a design is simply or easily capable of being changed. The inventive concepts may also include technologies easily changed to be implemented using such example embodiments.

What is claimed is:

1. A memory system comprising:
   a nonvolatile memory device including a data area and a device information area, the device information area being inaccessible by a host; and
   a controller configured to perform a training operation with respect to a data signal transmitted to or received from the nonvolatile memory device based on training information stored in the device information area, the controller being configured to select a selected one of a first training operation and a second training operation based on an identification code of the training information, and to perform the selected one of the first training operation and the second training operation such that,
   the first training operation is performed based on a rooted training code generated by the controller, wherein the first training operation is a rooted training operation that includes checking all sections of the data signal based on the rooted training code including all training codes within a training range, and
   the second training operation is performed based on a dynamic training code of the training information, the second training operation including performing a fewer number of searches than the first training operation, wherein the second training operation is a mirror training operation that includes checking only some of the sections of the data signal based on the dynamic training code.

2. The memory system of claim 1, wherein the controller is configured to perform the first training operation in response to the identification code being an initial identification code.

3. The memory system of claim 2, wherein the controller is configured to change the initial identification code to a post identification code for performing the second training operation, and store the post identification code in the device information area, after the controller completes the first training operation.

4. The memory system of claim 3, wherein the controller is configured to perform the second training operation in response to the identification code being the post identification code.

5. The memory system of claim 1, wherein the mirror training operation includes checking a section of the data signal corresponding to a training code spaced a specific interval apart from the dynamic training code and searching a center of the data signal according to a checking result.

6. The memory system of claim 4, wherein the controller is configured to update the identification code and the dynamic training code in the device information area after the controller completes the second training operation.

7. The memory system of claim 1, wherein the controller includes a training management unit configured to manage the identification code and the dynamic training code, the training management unit comprising:
an identification code register configured to temporarily store the identification code;
a training code register configured to temporarily store the dynamic training code;
a multiplexer configured to output one of the rooted training code and the dynamic training code of the training code register according to the identification code of the identification code register;
a training delay control circuit configured to perform the selected one of the first training operation and the second training operation based on an output value of the multiplexer; and
a training code update circuit configured to update the identification code and the dynamic training code in the device information area based on a result value of the selected one of the first training operation and the second training operation performed by the training delay control circuit.

8. A memory system comprising:
a nonvolatile memory device including a data area and a device information area, the device information area being inaccessible by a host;
a dynamic random access memory configured to temporarily store data received from the host and data read from the nonvolatile memory device; and
a controller configured to perform a DRAM training operation with respect to a data signal transmitted to or received from the dynamic random access memory based on DRAM training information stored in the device information area, the controller being configured to select a selected one of a first DRAM training operation and a second DRAM training operation based on a DRAM identification code of the DRAM training information, and to perform the selected one of the first DRAM training operation and the second DRAM training operation such that,
the first DRAM training operation is performed based on a DRAM rooted training code generated by the controller, wherein the first DRAM training operation is a DRAM rooted training operation that includes checking all sections of the data signal based on the DRAM rooted training code including all training codes within a training range, and
the second DRAM training operation is performed based on a DRAM dynamic training code of the DRAM training information, the second DRAM training operation including performing a fewer number of searches than the first DRAM training operation, wherein the second DRAM training operation is a DRAM mirror training operation that includes checking only some of the sections of the data signal based on the DRAM dynamic training code.

9. The memory system of claim 8, wherein the controller is configured to perform the first DRAM training operation in response to the DRAM identification code being an initial DRAM identification code.

10. The memory system of claim 9, wherein the controller is configured to perform the second DRAM training operation in response to the DRAM identification code being a post DRAM identification code.

11. The memory system of claim 8, wherein the nonvolatile memory device includes a ZQ management unit configured to selectively perform one of a first ZQ calibration operation and a second ZQ calibration operation based on ZQ calibration information stored in the device information area, wherein the ZQ calibration information includes a ZQ identification code.

12. The memory system of claim 11, wherein the ZQ management unit is configured to perform the first ZQ calibration operation, in response to the ZQ identification code being an initial ZQ identification code, based on a ZQ initial calibration code generated by the ZQ management unit.

13. The memory system of claim 12, wherein the ZQ management unit is configured to perform the second ZQ calibration operation, in response to the ZQ identification code being a post ZQ identification code, based on a ZQ dynamic calibration code of the ZQ calibration information.

14. A controller configured to communicate with one or more of a nonvolatile memory device and a dynamic random access memory, the nonvolatile memory device including a data area and a device information area, the device information area storing training information and being inaccessible by a host, and the dynamic random access memory configured to temporarily store data received from the host and data read from the nonvolatile memory device, the controller comprising:
at least one processor configured to selectively perform one or more of a rooted training operation and a mirror training operation with respect to at least one data signal based on the training information stored in the device information area, the at least one data signal being transmitted to or received from at least one of the nonvolatile memory device and the dynamic random access memory, the training information including one or more of an NVM identification code and a DRAM identification code, the mirror training operation including performing a fewer number of searches than the rooted training operation.

15. The controller of claim 14, wherein:
the at least one processor is configured to selectively perform the rooted training operation by performing at least one of,
an NVM rooted training operation based on an NVM rooted training code generated by the controller in response to the training information including an initial NVM identification code, and
a DRAM rooted training operation based on a DRAM rooted training code generated by the controller in response to the training information including an initial DRAM identification code; and the at least one processor is configured to selectively perform the mirror training operation by performing at least one of,
- an NVM mirror training operation based on an NVM dynamic training code of the training information in response to the training information including a post NVM identification code, and
- a DRAM mirror training operation based on a DRAM dynamic training code of the training information in response to the training information including a post DRAM identification code.

16. The controller of claim 15, wherein the at least one processor is configured to selectively perform,
- the NVM rooted training operation by checking all sections of the at least one data signal based on the NVM rooted training code including all NVM training codes within an NVM training range,
- the DRAM rooted training operation by checking all sections of the at least one data signal based on the DRAM rooted training code including all DRAM training codes within a DRAM training range,
- the NVM mirror training operation by checking only some of the sections of the at least one data signal based on the NVM dynamic training code, wherein the NVM mirror training operation includes checking a section of the at least one data signal corresponding to an NVM training code spaced a specific interval apart from the NVM dynamic training code and searching a center of the at least one data signal according to an NVM checking result, and
- the DRAM mirror training operation by checking only some of the sections of the at least one data signal based on the DRAM dynamic training code, wherein the DRAM mirror training operation includes checking a section of the at least one data signal corresponding to a DRAM training code spaced a specific interval apart from the DRAM dynamic training code and searching a center of the at least one data signal according to a DRAM checking result.

17. The controller of claim 16, wherein the at least one processor is further configured to,
change the initial NVM identification code to the post NVM identification code for performing the NVM mirror training operation, and store the post NVM identification code in the device information area, after completing the NVM rooted training operation, change the initial DRAM identification code to the post DRAM identification code for performing the DRAM mirror training operation, and store the post DRAM identification code in the device information area, after completing the DRAM rooted training operation, update the NVM identification code and the NVM dynamic training code of the training information in the device information area after completing the NVM mirror training operation, and update the DRAM identification code and the DRAM dynamic training code of the training information in the device information area after completing the DRAM mirror training operation.

18. The controller of claim 14, wherein,
the device information area further stores ZQ calibration information, wherein the ZQ calibration information includes a ZQ identification code, and the nonvolatile memory device is configured to selectively perform at least one ZQ calibration operation based on the ZQ calibration information stored in the device information area, wherein the nonvolatile memory device is configured to selectively perform one or more of,
- a first ZQ calibration operation based on a ZQ initial calibration code generated in response to the ZQ identification code being an initial ZQ identification code, and
- a second ZQ calibration operation based on a ZQ dynamic calibration code of the ZQ calibration information in response to the ZQ identification code being a post ZQ identification code, wherein the nonvolatile memory device is further configured to,
  change the initial ZQ identification code to the post ZQ identification code for performing the second ZQ calibration operation, and store the post ZQ identification code in the device information area, after completing the first ZQ calibration operation, and
  update the ZQ identification code and the ZQ dynamic calibration code in the device information area after completing the second ZQ calibration operation.

* * * * *